United States Patent
Irsigler et al.

(10) Patent No.: US 8,956,960 B2
(45) Date of Patent: Feb. 17, 2015

(54) METHOD FOR STRESS REDUCED MANUFACTURING SEMICONDUCTOR DEVICES

(71) Applicant: Infineon Technologies AG, Neubiberg (DE)

(72) Inventors: Peter Irsigler, Obernberg/Inn (AT); Hans-Joachim Schulze, Taufkirchen (DE)

(73) Assignee: Infineon Technologies AG, Neubiberg (DE)

( * ) Notice: Subject to any disclaimer, the term of this patent is extended or adjusted under 35 U.S.C. 154(b) by 77 days.

(21) Appl. No.: 13/679,347

(22) Filed: Nov. 16, 2012

(65) Prior Publication Data
US 2014/0141592 A1    May 22, 2014

(51) Int. Cl.
*H01L 21/20*    (2006.01)
*H01L 21/36*    (2006.01)
*H01L 21/762*    (2006.01)
*C30B 25/18*    (2006.01)
*C30B 25/04*    (2006.01)

(52) U.S. Cl.
CPC ........ *H01L 21/76224* (2013.01); *C30B 25/183* (2013.01); *C30B 25/04* (2013.01)
USPC .............................................. 438/481; 117/9

(58) Field of Classification Search
CPC ............................. C30B 25/04; C30B 25/183
USPC ............................................... 438/481; 117/9
See application file for complete search history.

(56) References Cited

U.S. PATENT DOCUMENTS

| | | | | |
|---|---|---|---|---|
| 5,750,432 | A * | 5/1998 | McLachlan | 438/404 |
| 5,786,988 | A * | 7/1998 | Harari | 361/749 |
| 5,872,043 | A * | 2/1999 | Chen | 438/424 |
| 6,261,929 | B1 * | 7/2001 | Gehrke et al. | 438/478 |
| 6,341,070 | B1 * | 1/2002 | Yu | 361/760 |
| 6,518,129 | B2 * | 2/2003 | Hueting et al. | 438/270 |
| 7,435,666 | B2 * | 10/2008 | Park | 438/479 |
| 7,855,409 | B2 * | 12/2010 | Dong | 257/314 |
| 8,664,028 | B2 * | 3/2014 | Shibata et al. | 438/46 |

(Continued)

OTHER PUBLICATIONS

Wolfgang Werner et al. "Method for Manufacturing a Semiconductor Substrate, and Method for Manufacturing Semiconductor Devices Integrated in a Semiconductor Substrate ." U.S. Appl. No. 13/628,301, filed Sep. 27, 2012.

*Primary Examiner* — Nicholas Tobergte
(74) *Attorney, Agent, or Firm* — Murphy, Bilak & Homiller, PLLC

(57) ABSTRACT

According to an embodiment, a method for stress-reduced forming a semiconductor device includes: providing a semiconductor wafer including an upper side and a first semiconductor layer of a first semiconductor material at the upper side; forming, in a vertical cross-section which is substantially orthogonal to the upper side, at the upper side a plurality of first vertical trenches and a plurality of second vertical trenches between adjacent first vertical trenches so that the first vertical trenches have, in the vertical cross-section, a larger horizontal extension than the second vertical trenches; and forming a plurality of third semiconductor layers at the upper side which are, in the vertical cross-section, spaced apart from each other by gaps each of which overlaps, in the vertical cross-section, with a respective first vertical trench when seen from above. At least one of the third semiconductor layers includes a semiconductor material which is different to the first semiconductor material.

27 Claims, 15 Drawing Sheets

(56) References Cited

U.S. PATENT DOCUMENTS

| | | | |
|---|---|---|---|
| 8,680,645 B2* | 3/2014 | Hirler et al. | 257/506 |
| 2001/0005022 A1* | 6/2001 | Ogura | 257/103 |
| 2009/0079035 A1 | 3/2009 | Wang | |
| 2011/0042718 A1* | 2/2011 | Wang et al. | 257/190 |
| 2012/0080686 A1 | 4/2012 | Mauder et al. | |
| 2012/0119218 A1* | 5/2012 | Su | 257/76 |
| 2012/0161254 A1 | 6/2012 | Kautzsch et al. | |
| 2013/0037857 A1* | 2/2013 | Von Kanel et al. | 257/190 |
| 2013/0248993 A1* | 9/2013 | Sedlmaier et al. | 257/334 |

\* cited by examiner

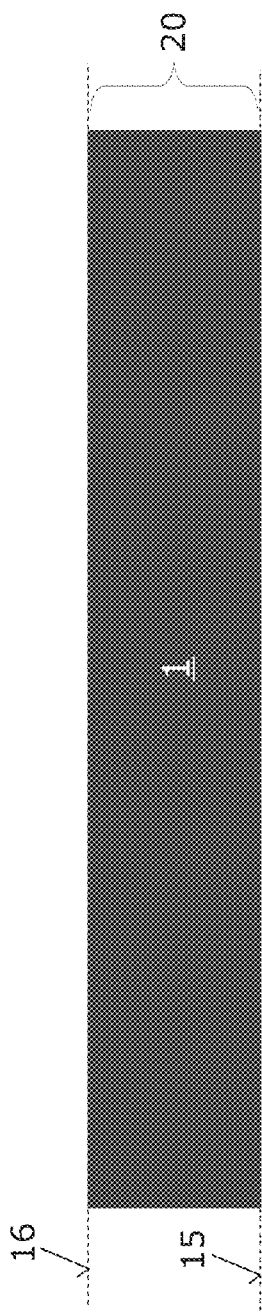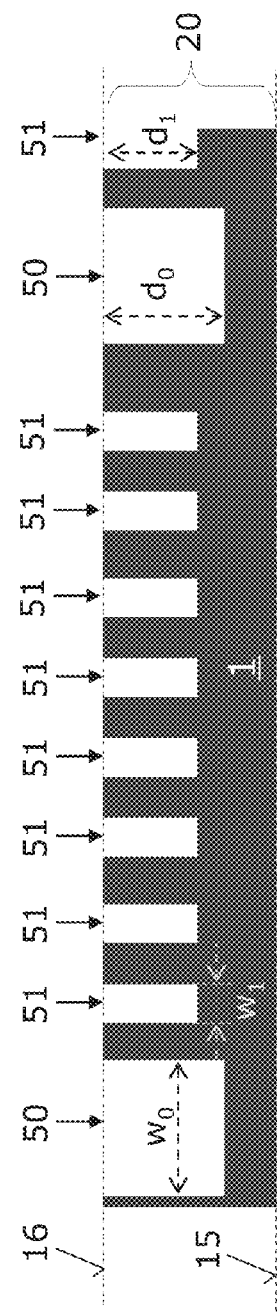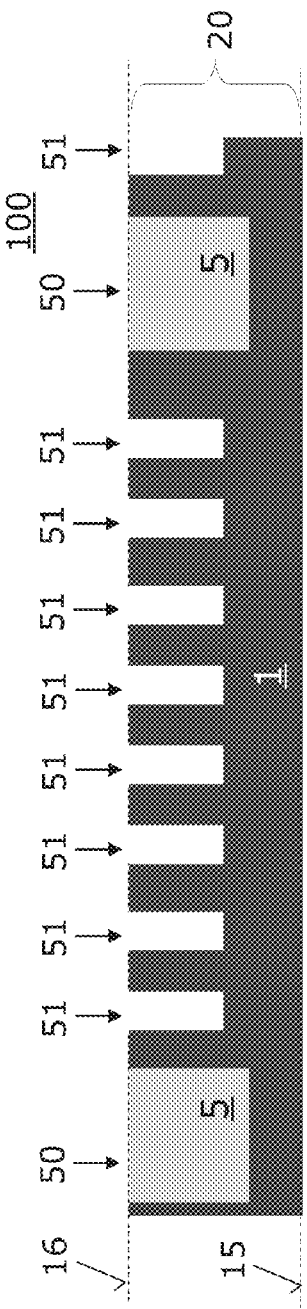

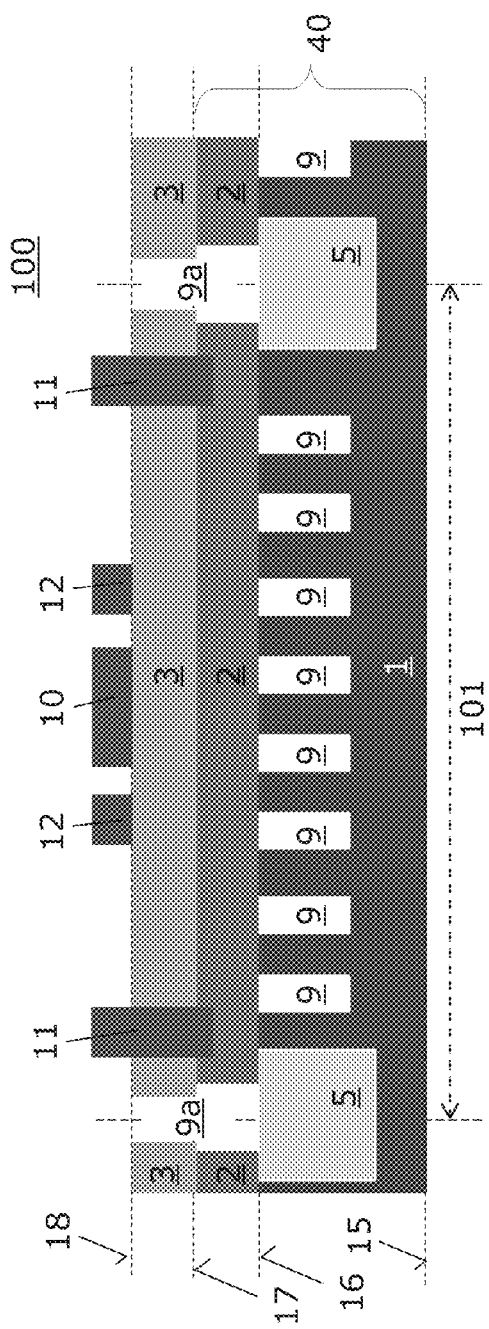
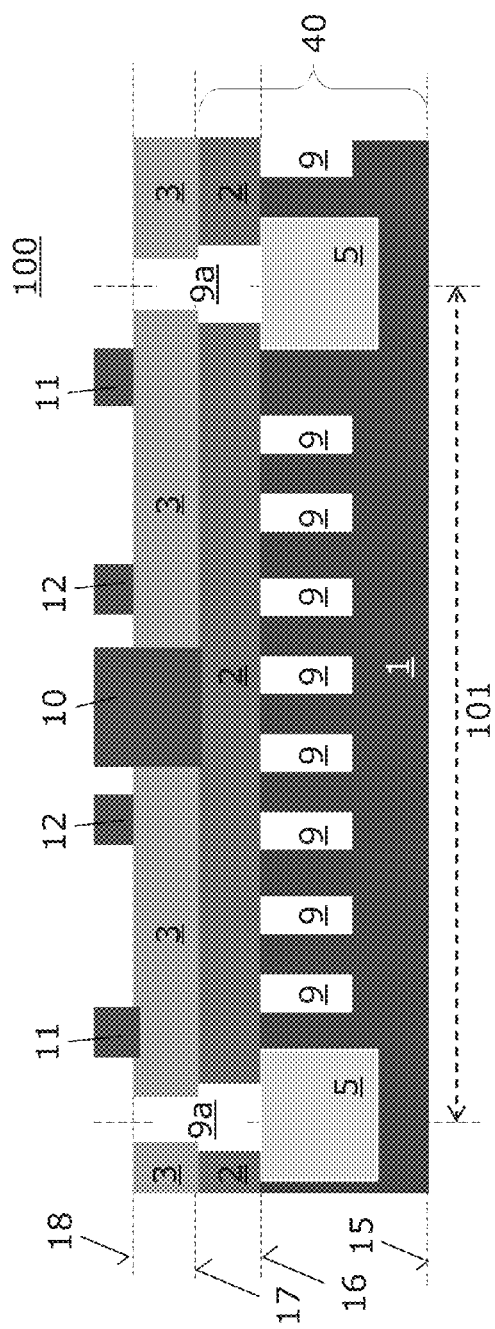
FIG 3A
FIG 3B

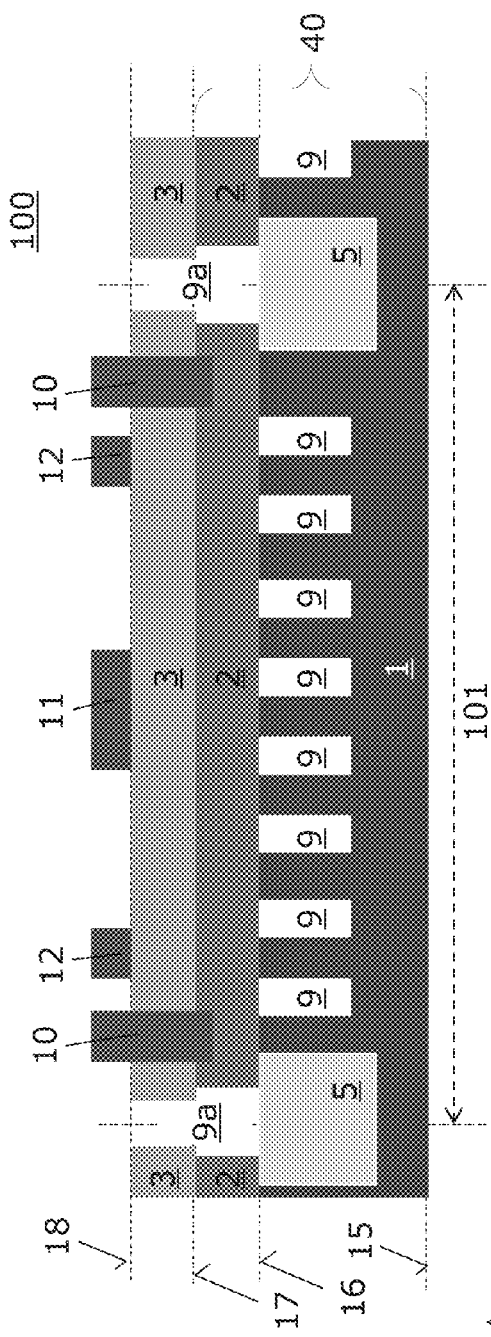
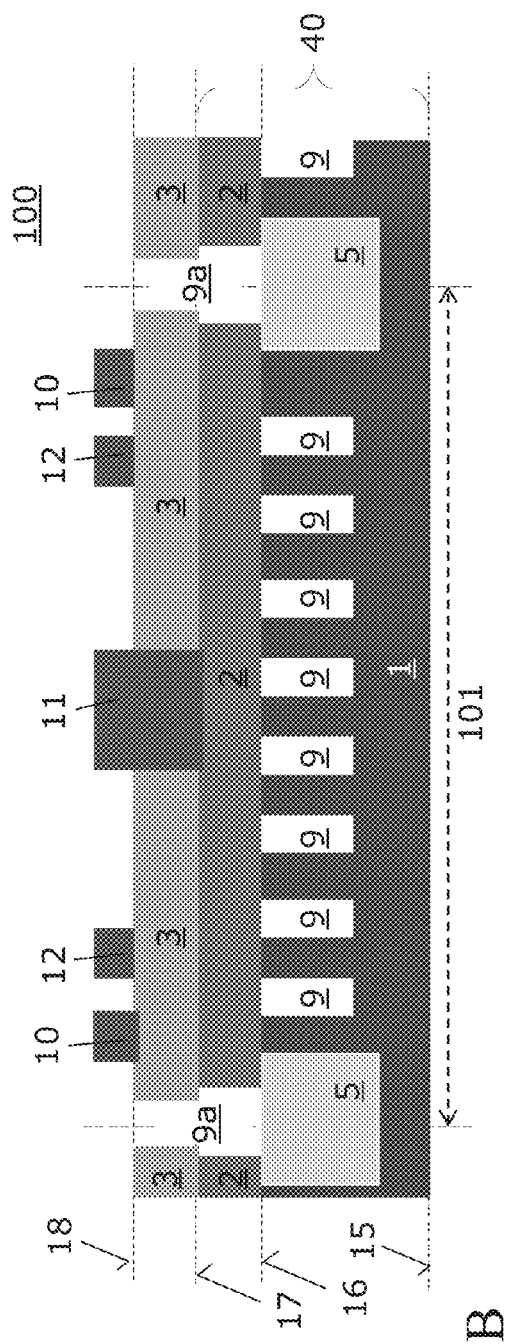
FIG 4A
FIG 4B

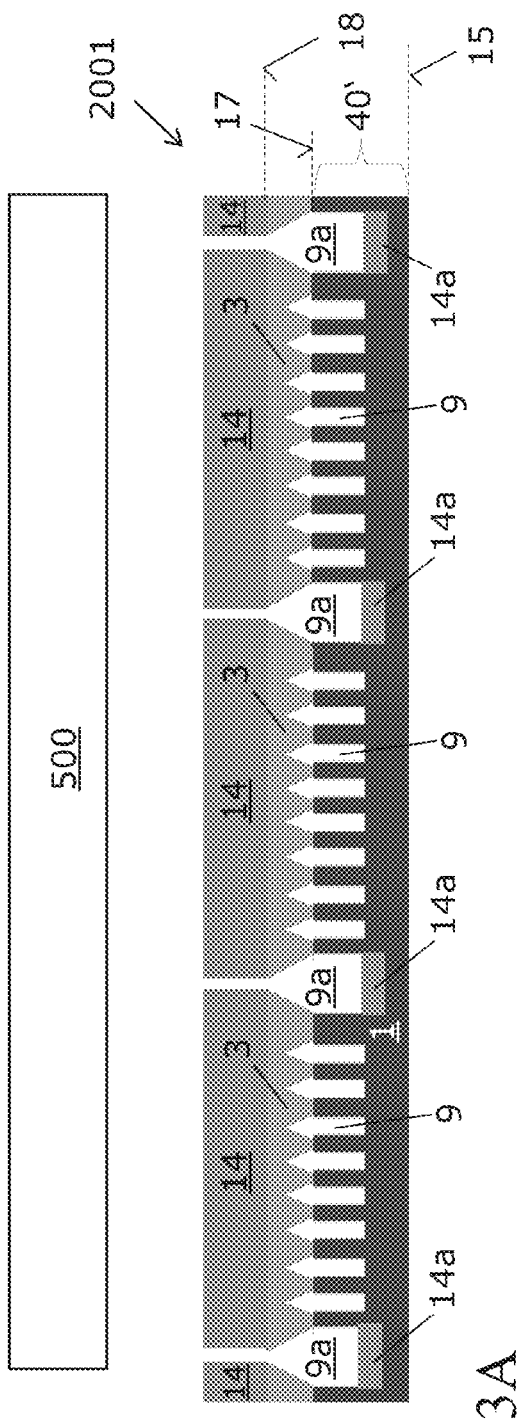
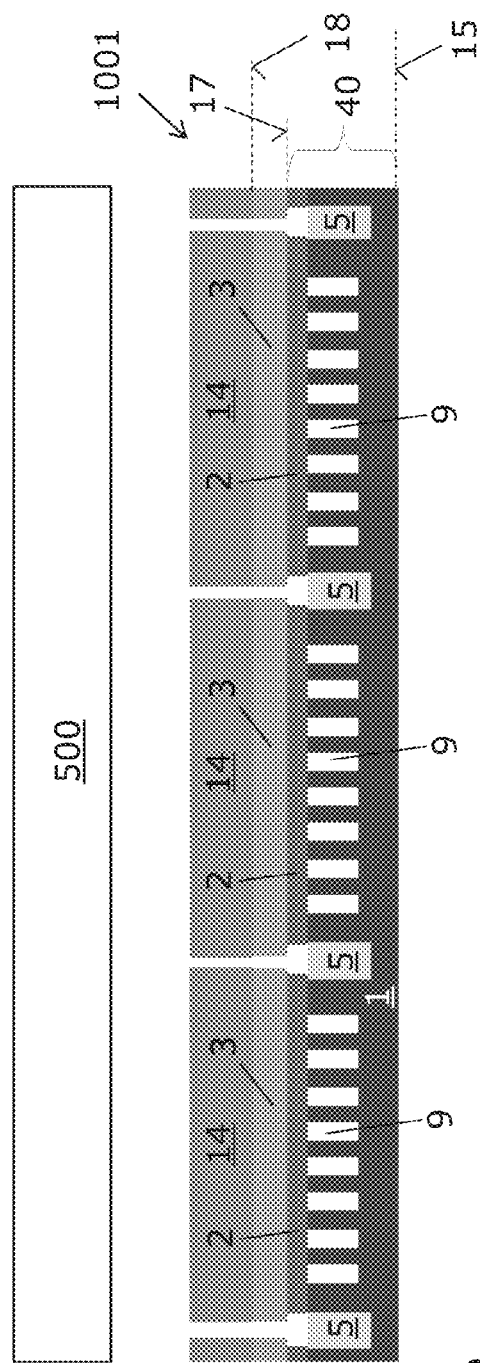
FIG 13A
FIG 13B

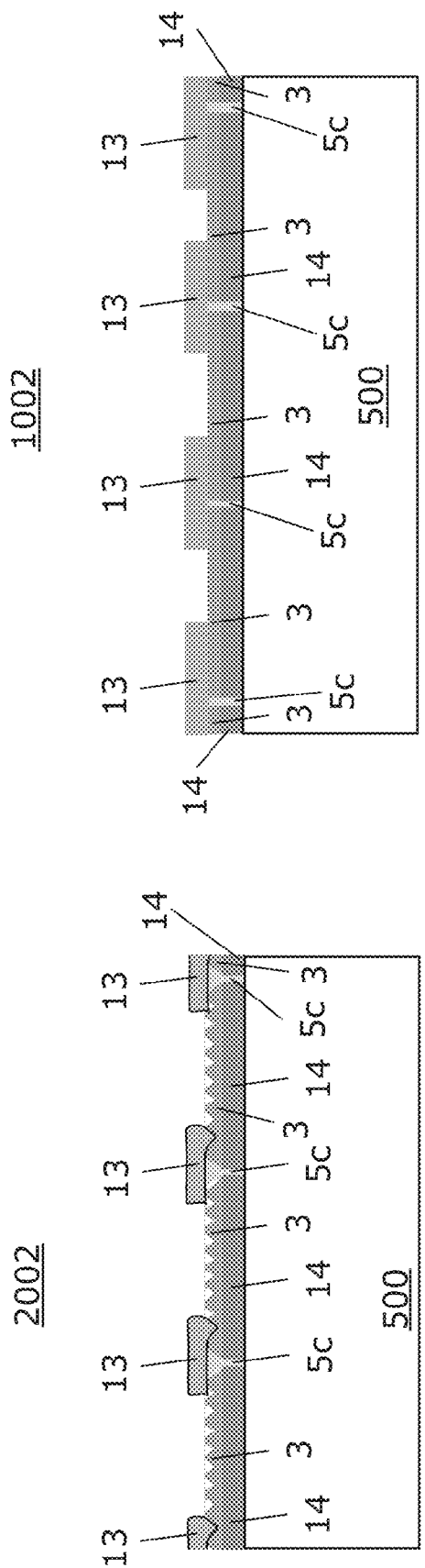

METHOD FOR STRESS REDUCED MANUFACTURING SEMICONDUCTOR DEVICES

TECHNICAL FIELD

Embodiments described herein relate to methods for stress-reduced manufacturing semiconductor devices, in particular to methods for stress-reduced manufacturing compound semiconductor devices.

BACKGROUND

Compared to silicon (Si), compound semiconductor materials offer several advantages with regard to device performance which makes them attractive for use in high-power and high-frequency electronics. For example, high band-gap compound materials such as silicon carbide (SiC) or gallium arsenide (GaN) have a high breakdown field strength and high critical avalanche field strength. Accordingly, the doping of the semiconductor regions can, in comparison to silicon semiconductor regions, be higher at given rated blocking voltage. This reduces the on-state resistance Ron of the device. Other compound semiconductor materials such as indium phosphide (InP) offer a much higher electron mobility than silicon. Accordingly, compound semiconductor devices with higher switching speeds and/or lower on-state resistance Ron may be provided.

For manufacturing semiconductor devices, for example power devices, suitably adapted semiconductor substrates are needed. For cost reasons, semiconductor devices are preferably manufactured on large wafers. However, larger monocrystals of compound semiconductor materials and monocrystalline compound wafers of more than about 8" in diameter, respectively, are either not available or very expensive.

Other approaches use a layer of the compound semiconductor material formed on a substrate wafer by epitaxy. However, due to the different crystal lattices, mechanical stress typically occurs during processing. This may, for example, result in wafer bowing. The mechanical stress may even have an impact on the performance of the devices to be manufactured. For example, the crystal quality of the epitaxially formed compound semiconductor layer may be affected. Furthermore, larger substrate wafers that are adapted to the compound semiconductor material with respect to their crystal lattice and thermal properties are typically also very expensive.

In view of the above, there is a need for improvement.

SUMMARY

According to an embodiment, a method for stress-reduced forming a semiconductor device includes: providing a semiconductor wafer including an upper side and a first semiconductor layer of a first semiconductor material at the upper side; forming, in a vertical cross-section which is substantially orthogonal to the upper side, at the upper side a plurality of first vertical trenches and a plurality of second vertical trenches between adjacent first vertical trenches so that the first vertical trenches have, in the vertical cross-section, a larger horizontal extension than the second vertical trenches; and forming a plurality of third semiconductor layers at the upper side which are, in the vertical cross-section, spaced apart from each other by gaps each of which overlaps, in the vertical cross-section, with a respective first vertical trench when seen from above. At least one of the third semiconductor layers includes a semiconductor material which is different to the first semiconductor material.

According to an embodiment, a method for stress-reduced forming a semiconductor device includes: providing a semiconductor wafer including an upper surface and a first semiconductor layer of a first semiconductor material extending to the upper surface; forming, in a vertical cross-section which is substantially orthogonal to the upper surface, at least two first vertical trenches extending from the upper surface into the first semiconductor layer and a plurality of second vertical trenches which extend from the upper surface into the first semiconductor layer and are arranged between the at least two first vertical trenches; filling the at least two first vertical trenches with a dielectric material to form, in the vertical cross-section, a dielectric plug in each of the at least two first vertical trenches; forming a second semiconductor layer of the first semiconductor material on the upper surface so that, in the vertical cross-section, a closed cavity is formed in each of the second vertical trenches; and selective epitaxial depositing a second semiconductor material on the second semiconductor layer to form a third semiconductor layer so that each of the dielectric plugs is at most partly covered when seen from above.

According to an embodiment, a method for stress-reduced forming a semiconductor device includes: providing a semiconductor wafer including an upper surface and a first semiconductor layer of a first semiconductor material extending to the upper surface; forming, in a vertical cross-section which is substantially orthogonal to the upper surface, at least two first vertical trenches extending from the upper surface into the first semiconductor layer and a plurality of second vertical trenches which extend from the upper surface into the first semiconductor layer, are arranged between the at least two first vertical trenches and have a smaller horizontal extension than the at least two first vertical trenches; covering the side walls and the bottom walls of the at least two first vertical trenches and the second vertical trenches with a dielectric layer; and epitaxial depositing a second semiconductor material at the upper surface to form a third semiconductor layer so that, in the vertical cross-section, a closed cavity is formed in each of the second vertical trenches and that the at least two first vertical trenches are at most partly covered by the third semiconductor layer.

BRIEF DESCRIPTION OF THE DRAWINGS

The components in the figures are not necessarily to scale, instead emphasis being placed upon illustrating the principles of the invention. Moreover, in the figures, like reference numerals designate corresponding parts. In the drawings:

FIGS. 1A to 3A illustrate, in vertical cross-sections, a method for manufacturing semiconductor devices according to an embodiment;

FIGS. 3B to 4B illustrate, in vertical cross-sections, semiconductor devices that may be manufactured with the method illustrated in FIGS. 1A to 3A according to embodiments;

FIGS. 13A to 15B illustrate, in vertical cross-sections, a method for manufacturing semiconductor devices according to still further embodiments.

Figure 2A:
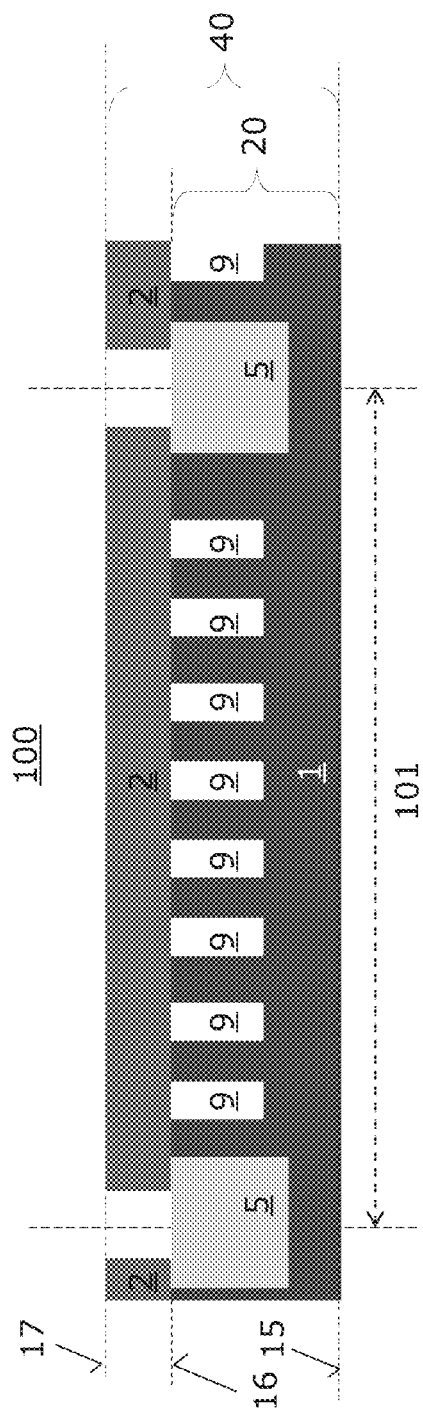

Those skilled in the art will recognize additional features and advantages upon reading the following detailed description, and upon viewing the accompanying drawings.

DETAILED DESCRIPTION

In the following Detailed Description, reference is made to the accompanying drawings, which form a part hereof, and in which are shown by way of illustration specific embodiments in which the invention may be practiced. In this regard, directional terminology, such as "top", "bottom", "front", "back", "leading", "trailing" etc., is used with reference to the orientation of the Figure(s) being described. Because components of embodiments can be positioned in a number of different orientations, the directional terminology is used for purpose of illustration and is in no way limiting. It is to be understood that other embodiments may be utilised and structural or logical changes may be made without departing from the scope of the present invention. The following detailed description, therefore, is not to be taken in a limiting sense, and the scope of the present invention is defined by the appended claims. The embodiments being described use specific language, which should not be construed as limiting the scope of the appended claims. The embodiments can be combined unless noted otherwise. The drawings are not drawn to scale.

The term "horizontal" as used in this specification intends to describe an orientation parallel to a first surface of a semiconductor substrate, for example a semiconductor wafer. In the following, the first surface is also referred to as upper surface and upper side, respectively.

The term "vertical" as used in this specification intends to describe an orientation, which is arranged perpendicular to the first surface of the semiconductor substrate.

In this specification, a second surface of a semiconductor substrate is considered to be formed by the lower or back-side surface while the first surface is considered to be formed by the upper, front or main surface of the semiconductor substrate. The terms "above" and "below" as used in this specification therefore describe a relative location of a structural feature to another structural feature with consideration of this orientation.

In this specification, n-doped is referred to as first conductivity type while p-doped is referred to as second conductivity type. Alternatively, the semiconductor devices can be formed with opposite doping relations so that the first conductivity type can be p-doped and the second conductivity type can be n-doped. Furthermore, some Figures illustrate relative doping concentrations by indicating "−" or "+" next to the doping type. For example, "n-" means a doping concentration which is less than the doping concentration of an "n"-doping region while an "n+"-doping region has a larger doping concentration than the "n"-doping region. However, indicating the relative doping concentration does not mean that doping regions of the same relative doping concentration have to have the same absolute doping concentration unless otherwise stated. For example, two different n+-doping regions can have different absolute doping concentrations. The same applies, for example, to an n+-doping and a p+-doping region.

The term "power semiconductor device" as used in this specification intends to describe a semiconductor device on a single chip with high voltage and/or high current switching capabilities. In other words, power semiconductor devices are intended for high current, typically in the Ampere range, and/or voltages above 10 V, more typically above 20 V.

In the context of the present specification, the terms "in ohmic contact" and "in contact" intends to describe that there is an ohmic electric connection or ohmic current path between two regions, portion or parts of a semiconductor device through the semiconductor device or between different electrodes of one or more devices or between an electrode or a metallization and a portion or a part of the semiconductor device. In the context of the present specification, the terms "low ohmic current path" and "low resistive current path" are used synonymously. Further, the terms "low ohmic contact" and "low resistive contact" are used synonymously in the context of the present specification.

In the context of the present specification, the term "metallization" intends to describe a region or a layer with metallic or near metallic properties with respect to electric conductivity. A metallization may be in contact with a semiconductor region to form an electrode, a pad and/or a terminal of the semiconductor device. The metallization may be made of a metal such as Al, Cu, W, Ti, Au, Ag, Ni, V, Sn and Co but may also be made of a material with metallic or near metallic properties with respect to electric conductivity such as highly doped n-type or p-type poly-Si (poly-silicon), TiN or an electrically conductive silicide such as $WSi_2$. The metallization may also include different electrically conductive materials, for ex-ample a stack of those materials.

In the following, embodiments pertaining to manufacturing of semiconductor devices are explained mainly with reference to gallium nitride (GaN) compound semiconductor devices using a silicon (Si) wafer or substrate as seed-wafer. It should, however, be understood that the semiconductor body of the semiconductor device to be manufactured can be made of any semiconductor material suitable for manufacturing a semiconductor device. Examples include elementary semiconductor materials such as silicon (Si) or germanium (Ge), group IV compound semiconductor materials such as silicon carbide (SiC) or silicon germanium (SiGe), binary, ternary or quaternary III-V semiconductor materials such as gallium nitride (GaN), gallium arsenide (GaAs), gallium phosphide (GaP), indium phosphide (InP), indium gallium phosphide (InGaP), aluminum gallium nitride (AlGaN), aluminum indium nitride (AlInN), indium gallium nitride (InGaN), aluminum gallium indium nitride (AlGaInN) or indium gallium arsenide phosphide (InGaAsP), and binary or ternary II-VI semiconductor materials such as cadmium telluride (CdTe) and mercury cadmium telluride (HgCdTe) to name few. The above mentioned semiconductor materials are also referred to as homojunction semi-conductor materials. When combining two different semiconductor materials a heterojunction semiconductor material is formed. Examples of heterojunction semiconductor materials include, without being limited thereto, aluminum gallium nitride (AlGaN)-aluminum gallium indium nitride (AlGaInN), indium gallium nitride (InGaN)-aluminum gallium indium nitride (AlGaInN), indium gallium nitride (InGaN)-gallium nitride (GaN), aluminum gallium nitride (AlGaN)-gallium nitride (GaN), indium gallium nitride (InGaN)-aluminum gallium nitride (AlGaN), silicon-silicon carbide ($Si_xC_{1-x}$) and silicon- SiGe heterojunction semiconductor materials. For power semiconductor applications currently mainly Si, SiC, GaAs and GaN materials are used. If the semiconductor body comprises a wide band-gap material such as SiC or GaN which has a high breakdown field strength and high critical avalanche field strength, respectively, the doping of the respective semiconductor regions can be chosen higher which reduces the on-resistance Ron. Furthermore, the leakage current across pn-junctions formed in wide band-gap materials is often negligible. The term "wide band-gap semiconductor material" as used in this specification intends to describe a semiconductor material with an electronic band-gap of about at least two electron volts (eV). It should further be understood that other semiconductor materials than silicon may be used as seed-wafer, for example germanium and germanium doped silicon.

With reference to FIGS. 1A to 3A a first embodiment is described. As illustrated in FIG. 1A, a semiconductor wafer 20 having an upper surface 16 and a lower surface 15 opposite to the upper surface 16 is provided. In this embodiment, the wafer 20 is made of Si but could also be comprised of other semiconductor material such as Ge or SiGe. The semiconductor wafer 20 at least includes a first semiconductor layer 1 of a first semiconductor material extending to the upper surface 16. In the exemplary embodiment, the wafer 20 and the first semiconductor layer 1, respectively, are made of Si but could also be made of other semiconductor material such as Ge or SiGe.

In a further process, at least two first vertical trenches 50 and a plurality of second vertical trenches 51 between the at least two first vertical trenches 50 are formed in a vertical cross-section, typically by etching respective trenches from the upper surface 16 into the first semiconductor layer 1. In so doing, a plurality of semiconductor mesas, which may also be referred to a semiconductor lamellas, are formed between the at least two first vertical trenches 50.

Typically, the area of the semiconductor mesas corresponds to about 2% to about 40%, more typically to about 5% to about 30%, and even more typically to about 10% to 20% of the surface area of the upper surface 16.

The first vertical trenches 50 and the second vertical trenches 51 may be formed by deep reactive-ion etching, using e.g. a Bosch process.

Note that the resulting semiconductor structure illustrated in FIG. 1B typically corresponds only to a small section through the semiconductor wafer 20. Accordingly, in the cross-section which is substantially orthogonal to the upper side 16, a plurality of first vertical trenches 50 and a plurality of second vertical trenches 51 between adjacent first vertical trenches 50 are typically formed.

According to an embodiment, the first vertical trenches 50 and the second vertical trenches 51 are formed such that the first vertical trenches 50 have, in the vertical cross-section, a first horizontal extension $w_0$ which is larger than a second horizontal extension $w_1$ of the second vertical trenches 51. This facilitates later forming of separated islands of a different semiconductor material between adjacent first vertical trenches 50 and above the semiconductor mesas.

Depending on the semiconductor devices to be manufactured, the first horizontal extension $w_0$ may be in a range from about 2 µm to about 20 µm, while the second horizontal extension $w_1$ may be in a range from about 0.5 µm to about 5 µm. Furthermore, the first vertical trenches 50 typically extend vertically deeper into the first semiconductor layer 1 than the second vertical trenches 51, i.e. to a first depth $d_0$ which is smaller than a second depth $d_1$ of the second vertical trenches 51. This may facilitate an optional later process of thinning the wafer 20 at the lower surface 15.

Depending on the semiconductor devices to be manufactured, the first depth $d_0$ may be in a range from about 1.5 µm to about 50 µm, while the second depth $d_1$ may be in a range from about 1 µm to about 40 µm.

Thereafter, the first vertical trenches 50 are filled with a dielectric material to form in the vertical cross-section a dielectric plug 5 in each of the first vertical trenches 50. The resulting wafer structure 100 is illustrated in FIG. 1C. For example, the dielectric plugs 5 may be formed by deposition of, for example, silicon dioxide ($SiO_2$), silicon nitride ($Si_3N_4$) or amorphous carbon (C), and a subsequent CMP-process (Chemical-Mechanical Polishing) at the upper surface 16. Any dielectric material deposited in the second vertical trenches 51 is removed, for example by masked etching.

In embodiments in which the wafer 20 is later to be thinned at the lower surface 15, the dielectric plugs 5 may be used as stop regions in a further CMP-process.

After forming the dielectric plugs 5, a second semiconductor layer 2 of the first semiconductor material is formed on the upper surface 16 of the wafer 20, typically by selective epitaxy or a so-called Venetia-process. In so doing a closed cavity 9 is, in the cross-section, formed in each of the second vertical trenches 51. The second semiconductor layer 2 may be monocrystalline but also a porous semiconductor layer or a poly-silicon layer.

The vertical extension of the second semiconductor layer 2 may be in a range from about 1 µm to about 10 µm.

According to an embodiment, the second semiconductor layer 2 is formed such that the dielectric plugs 5 are at most partly covered when seen from above. Typically, a plurality of second semiconductor layers 2 is formed which are in horizontal directions spaced apart from each other. For sake of clarity, only three second semiconductor layers 2 are illustrated in FIG. 2A. In so doing, a seed-wafer 40 with a plurality of separated islands 2 of the first semiconductor material may be formed. The diameter of the seed-wafer 40 in horizontal direction may be as large 200 mm, 300 mm or even larger. This facilitates efficient forming of compound semiconductor devices which include one or more device regions 101.

Figure 2B:
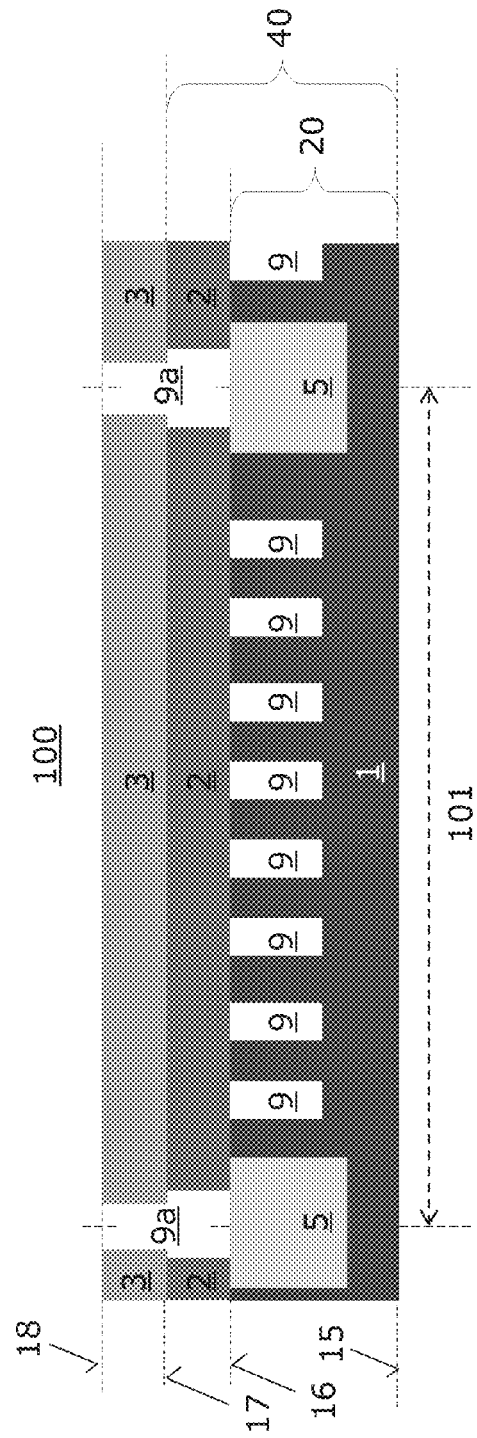

Thereafter, a selective epitaxial deposition process is used to form one or more third semiconductor layers 3 of a second semiconductor material such as GaN, GaAlN or CdTe or another compound semiconductor material on the top surface 17 of the respective second semiconductor layers 2 so that each of the dielectric plugs 5 is at most partly covered by the third semiconductor layers 3 when seen from above. Accordingly, the third semiconductor layers 3 are formed as of islands which are in a horizontal direction spaced apart from each other by gaps 9a. The resulting wafer structure 100 is illustrated in FIG. 2B.

The third semiconductor layers 3 typically grow as monocrystalline layers. To further improve crystal quality, an additional thermal process may be used.

Depending on the semiconductor devices to be manufactured, the vertical extension of the third semiconductor layers 3 may be in a range from about 2 µm to about 200 µm, more typically in a range from about 5 µm to about 150 µm.

The horizontal extension of the third semiconductor layers 3 is typically in a range from about 5 µm to about 10000 µm, more typically in a range from about 15 µm to about 5000 µm, even more typically in a range from about 20 µm to about 1000 µm. Note, that the horizontal extension of the third semiconductor layers 3 may, depending on the devices to be manufactured, vary.

Due to the separation of the third semiconductor layers 3, the overall mechanical stress resulting from the differences of the crystal lattices of the second semiconductor layers 2 and the third semiconductor layers 3 is at least reduced and may substantially be diffused via the semiconductor mesas. Accordingly, wafer bowing may substantially be avoided even when large seed-wafers 40 are used. Furthermore, the mechanical stress within each of the third semiconductor layers 3 may be reduced and thus the lattice quality improved. This may even result in improved device performance.

The seed-wafer 40 may be made of highly doped silicon, for example highly n-doped or highly p-doped silicon. Accordingly, the lattice mismatch between the seed-wafer 40 and the third semiconductor layers 3 may be reduced. This will result in a further reduction of the mechanical stress.

For example, the seed-wafer 40 may be made of boron-doped or phosphorus-doped mono-crystalline silicon having a specific resistance of less than about 10 m Ohm cm (milli Ohm centimeter), more typically of less than about 8 m Ohm cm, and even more typically of less than about 4 m Ohm cm. Accordingly, the lattice mismatch between the seed-wafer 40 and the third semiconductor layers 3 made of GaN is reduced. Note that the lattice constant of mono-crystalline silicon decreases monotonically with doping concentration of boron and phosphorous, respectively. For example, the lattice constant of boron doped mono-crystalline silicon is reduced by about 0.005%, 0.01% and 0.03% at specific resistances of about 10 m Ohm cm, 6 m Ohm cm and 2 m Ohm cm, respectively, compared to substantially un-doped mono-crystalline silicon. At very low specific resistances the lattice constant of boron doped mono-crystalline silicon may be reduced by up to about 3% or even more. Note that the lattice constant is typically a steeper function of the specific resistance for lower values of the specific resistance.

In further processes, one or more diodes, one or more resistors, one or more bipolar transistors, one or more field-effect structures and/or other semiconductor structures may be formed in the third semiconductor layers 3, each of which may correspond to single chips 101 to be separated.

Additionally, diodes, resistors, bipolar transistors, field-effect structures and/or other semiconductor structures may also be formed in a second semiconductor layer 2 of a boundary region in which no third semiconductor layer 3 was formed, i.e. in silicon in the exemplary embodiment. Accordingly, cascode circuits may be realized.

Furthermore, contact metallization or terminals, for example a source metallization 10, a drain metallization 11 and a gate metallization 12 may be formed on the top surface 18 of the third semiconductor layers 3. Examples for exemplary MOSFETs, typically power MOSFETS, are illustrated in FIGS. 3A to 4B. FIGS. 3A and 4A schematically show MOSFETs 101 in a so-called source-up configuration. FIGS. 3B and 4B schematically show MOSFETs 101 in a so-called source-down configuration. The gate metallization 12 is typically closer to the source metallization 10 than to the drain metallization 11. Further, the drain metallization 11 or the source metallization 10 may be formed in an outer region of the MOSFETs 101 as illustrated in FIG. 3A, 3B and in FIG. 4A, 4B, respectively.

Thereafter, the wafer-structure 100 may be suitably thinned at the lower surface 15 using, for example, a CMP-process.

Furthermore, the wafer-structure 100 may be divided into individually chips 101 along the dielectric plugs 5 and voids or gaps 9a formed above the dielectric plugs 5, respectively. Dividing the wafer-structure 100 may be done by etching, laser-cutting or the CMP-process used for thinning.

Figure 5:
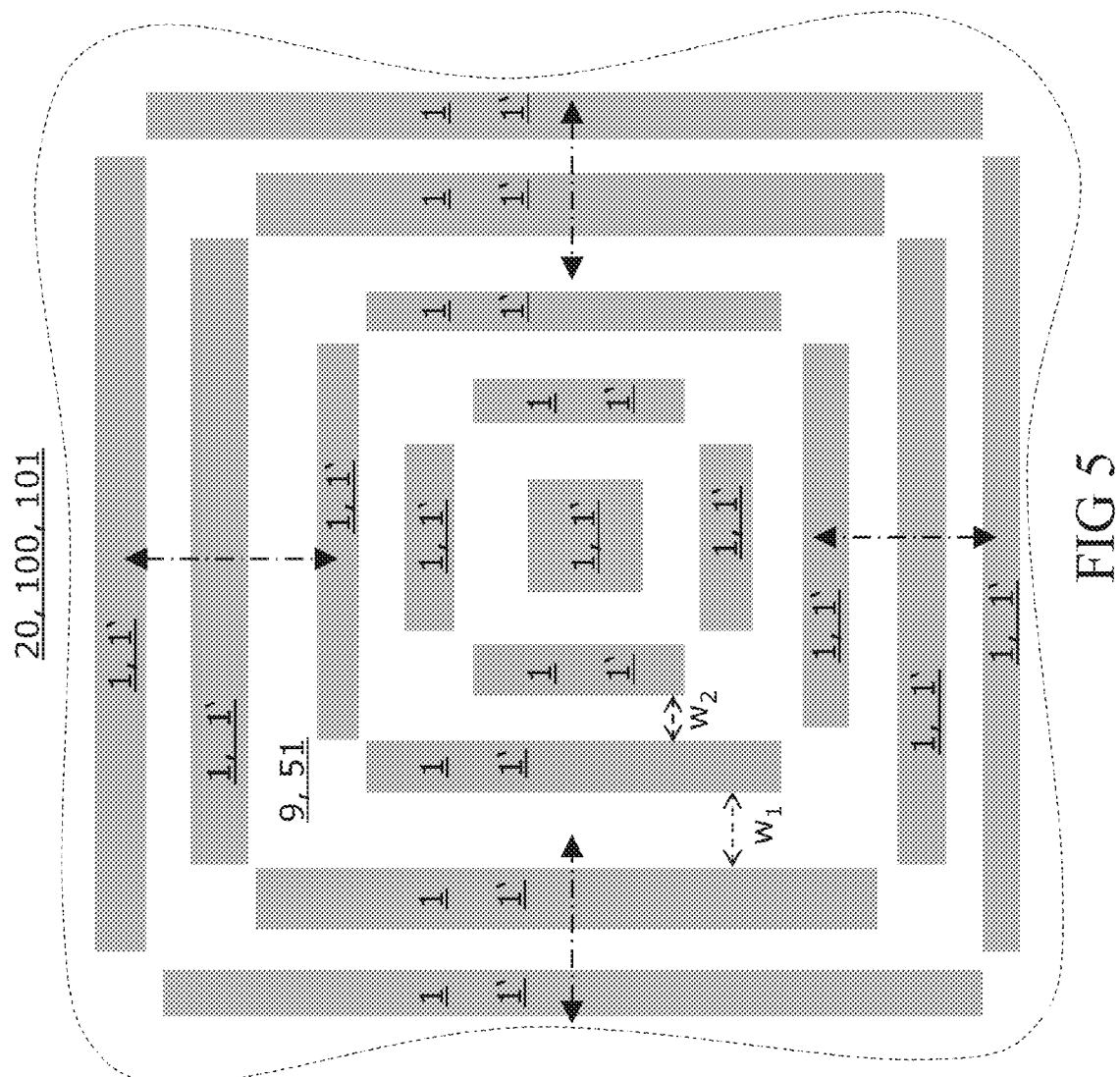
FIG. 5 illustrates, in a horizontal cross-section, an enlarged view of a central part of the semiconductor devices as illustrated in FIGS. 3A to 4B according an embodiment.

FIG. 5 illustrates, in a horizontal cross-section through the closed cavities 9 and mesas 1' of the first semiconductor layer 1, an enlarged view of a central part of the wafer-structure 100 as illustrated in FIGS. 1A to 4B between adjacent vertical trenches. In other words, the central part of the wafer-structure 100 as illustrated in FIGS. 1A to 4B may correspond to a section along a central horizontal or vertical line of FIG. 5.

According to an embodiment, the plurality of second vertical trenches 51 which are shown in vertical cross-sections between adjacent first vertical trenches 50 are portions of a contiguous second trench 51, i.e. a second trench 51 which is contiguous in horizontal cross-sections and when seen from above, respectively. Typically, each contiguous second trench 51 is surrounded by a circumferential portion of a contiguous first vertical trench. For sake of clarity, the first vertical trench is not shown in FIG. 5.

The semiconductor mesas 1' can virtually have any suitable shape and size. The semiconductor mesas 1' are typically formed as non-connected stripes, rectangles, ring-segments or the like when seen from above. Outer semiconductor mesas 1' may be arranged in a substantially concentric manner, but typically not in a closed circumferential manner when seen in a projection onto the upper surface 16 and in plane view, respectively. This improves distribution of mechanical stress as indicated by the dashed-dotted arrows in FIG. 5.

The main function of the semiconductor mesas 1' is to efficiently diffuse and/or distribute mechanical stress to lower portions of the seed-wafer 40.

Figure 6:
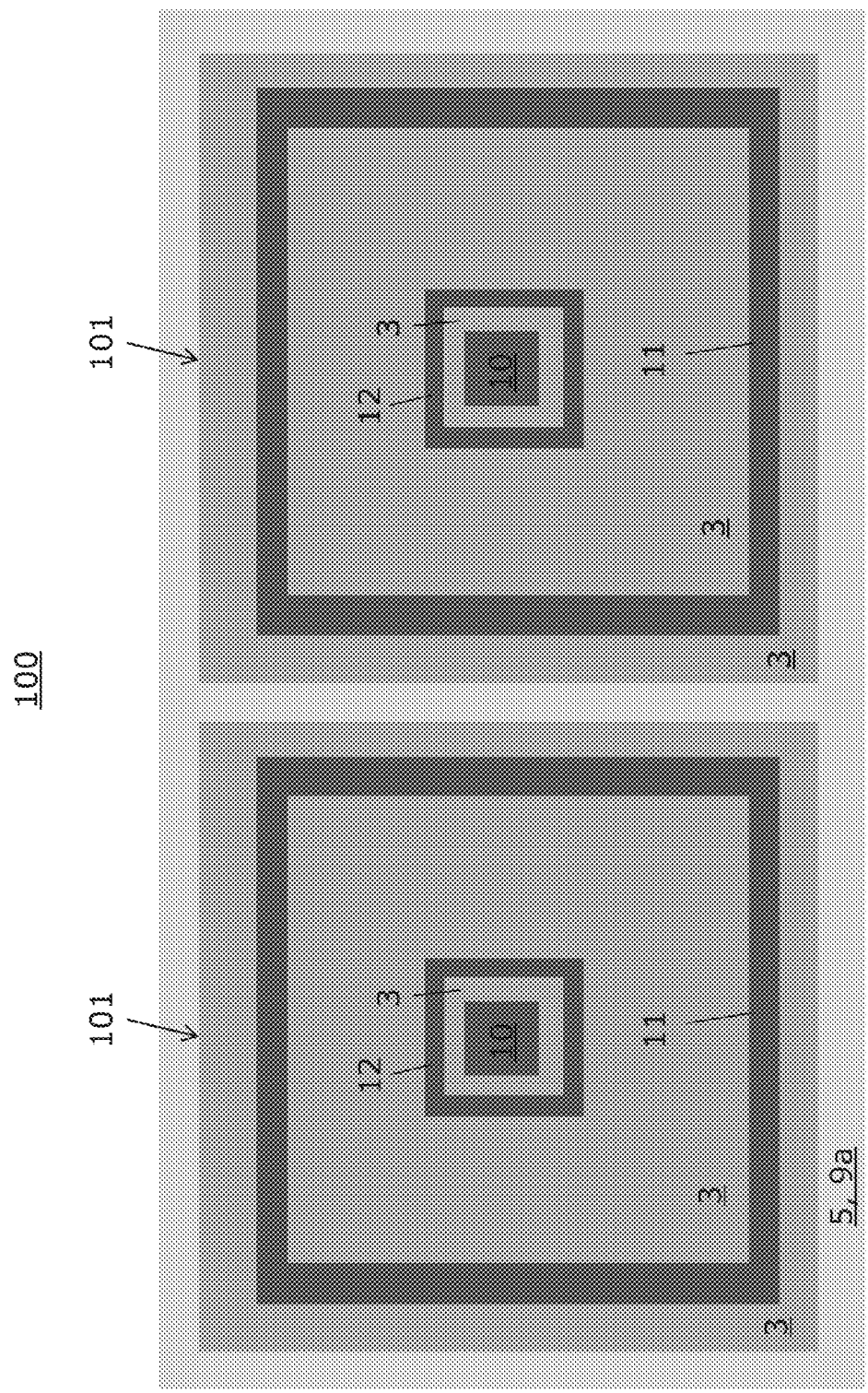
FIG. 6 illustrates, in plane views, semiconductor devices as illustrated in FIGS. 3A and 3B.
Figure 7:
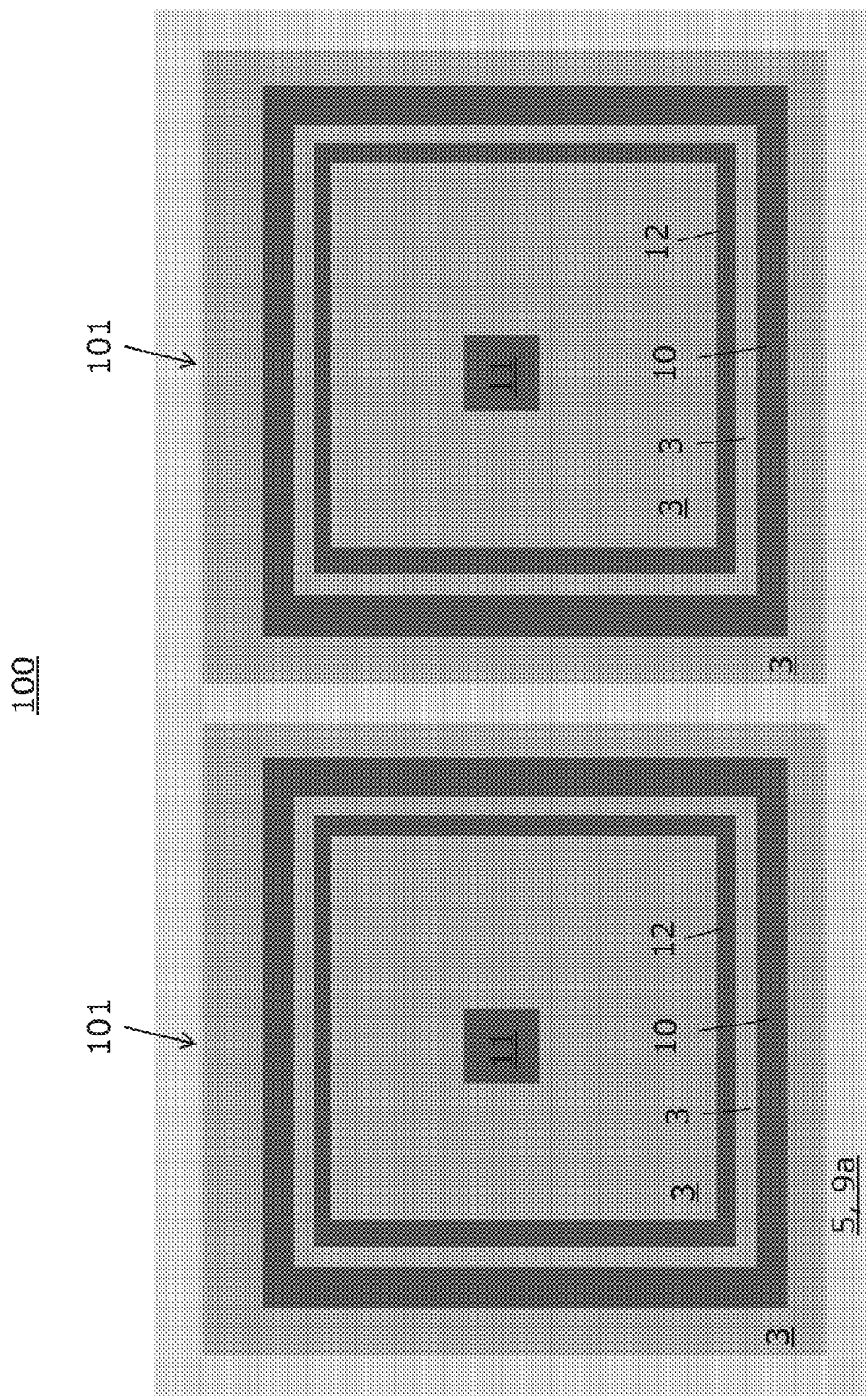
FIG. 7 illustrates, in plane views, semiconductor devices as illustrated in FIGS. 4A and 4B.

FIG. 6 illustrates, in a plane view, the wafer-structure 100 as illustrated in FIGS. 3A and 3B. In the exemplary embodiment, two MOSFETs 101 are shown. Likewise, FIG. 7 illustrates, in a plane view, the wafer-structure 100 with two exemplary MOSFETs as illustrated in FIGS. 4A and 4B.

Typically, the MOSFETs 101 form a regular lattice, for example a regular two dimensional lattice when seen from above. Accordingly, the plurality of third semiconductor layers 3 are formed such that they form, in a cross-section which is substantially parallel to the upper side, a lattice of insular, in horizontal direction non-connected third semiconductor layers 3. In this processing stage, the third semiconductor layers 3 are typically separated from each other in horizontal direction by gaps 9a arranged above the contiguous dielectric plug 5 formed in a contiguous first vertical trench. Accordingly, the plurality of first vertical trenches 50 and the gaps 9a are typically formed as respective contiguous meshes when seen from above.

Figure 8:
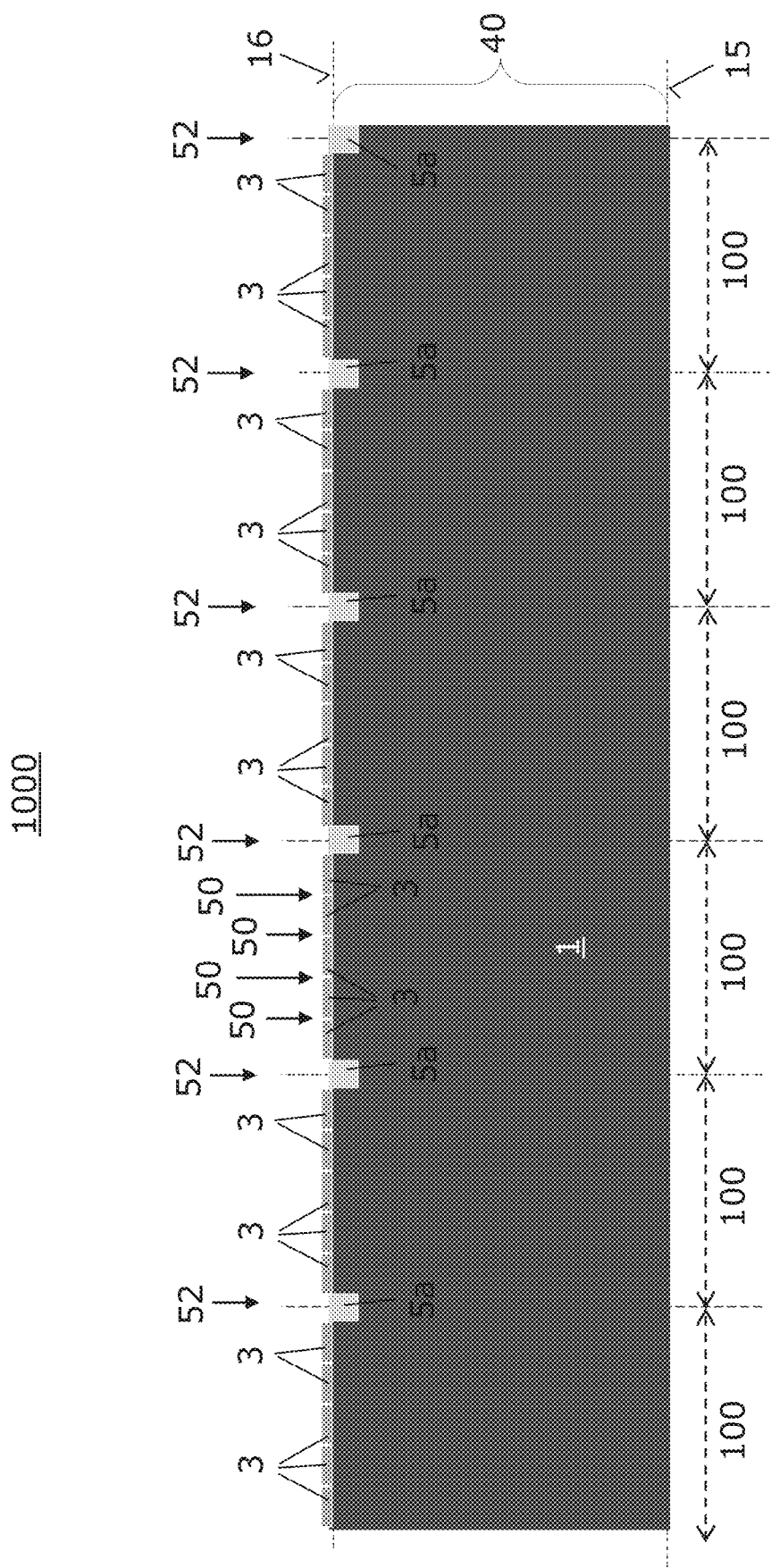
FIG. 8 illustrates, in a vertical cross-sections, a semiconductor wafer according to an embodiment.

FIG. 8 illustrates a semiconductor wafer structure 1000. In the exemplary embodiment, the wafer structure 1000 includes, in the vertical cross-section, wafer sub-structures 100 with five exemplary third semiconductor layers 3 as explained above with regard to FIGS. 2B to 7.

The semiconductor wafer structure 1000 may be formed similarly as explained above with regard to the FIGS. 1A to 7. In addition to forming first and second vertical trenches 50, 51, a plurality of third vertical trenches 52 which extend vertically deeper into the first semiconductor layer 1 than the first vertical trenches 50 are formed by etching and filled with a dielectric material such as $SiO_2$ or $Si_3N_4$ to form deep dielectric plugs 5a prior to forming the third semiconductor layers 3. Forming the deep dielectric plugs 5a, which typically extend vertically deeper into the first semiconductor layer 1 than the dielectric plugs 5, may be done in parallel with forming the dielectric plugs 5 (not shown in FIG. 8).

Thereafter, the semiconductor wafer structure 1000 may by suitably thinned at the lower surface 15, for example by a CMP process stopping at the deep dielectric plugs 5a.

After dividing the semiconductor wafer structure 1000 along the third vertical trenches 52, individual chips 100 with several semiconductor structures formed in respective third semiconductor layers 3 are provided.

Figure 9A:
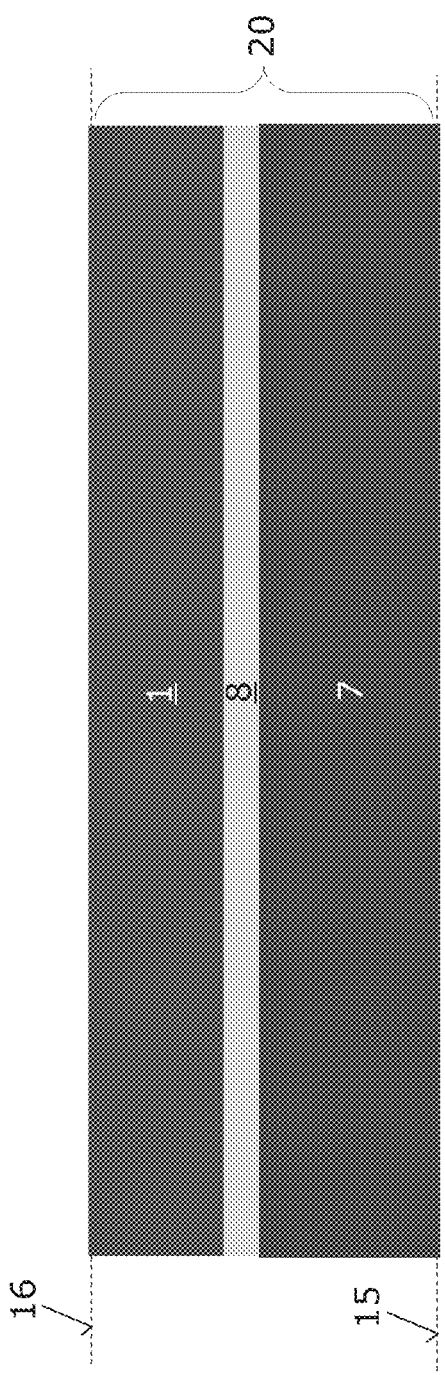
FIGS. 9A and 9B illustrate, in vertical cross-sections, a method for manufacturing semiconductor devices according to an embodiment.
Figure 9B:
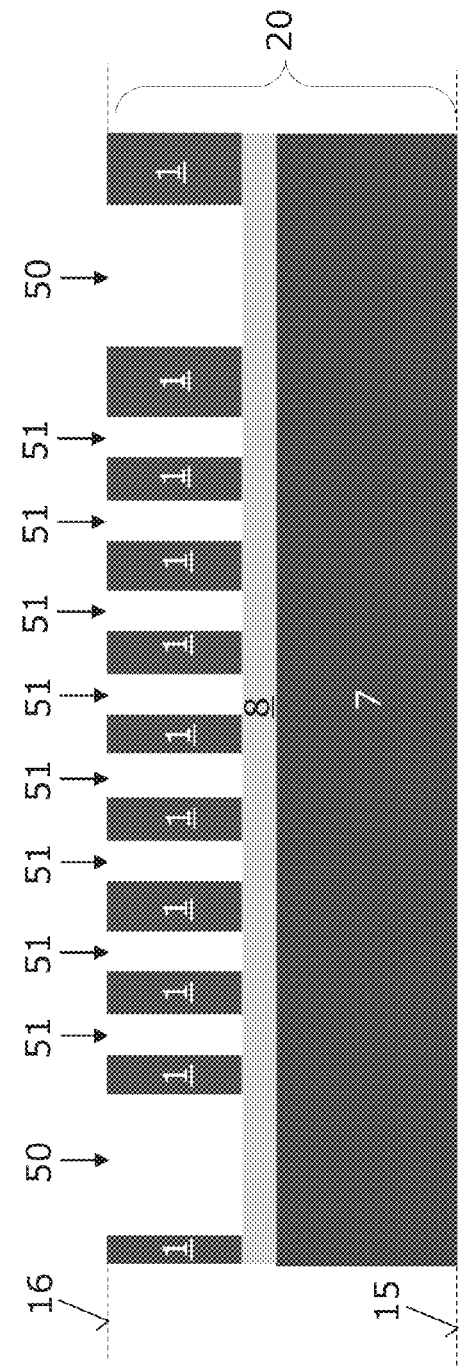

With regard to FIGS. 9A and 9B a further method for stress-reduced manufacturing semiconductor devices is explained. As illustrated in FIG. 9A, a semiconductor wafer 20 having an upper surface 16 and a lower surface 15 opposite to the upper surface 16 is provided. In this embodiment, the wafer 20 includes a common substrate 7, for example a common Si-substrate, a dielectric layer 8 formed on the common substrate 7, for example a $SiO_2$-layer, and a first semiconductor layer 1 of poly-crystalline silicon (poly-Si) formed on the dielectric layer 8 and extending to the upper surface 16.

Thereafter, first vertical trenches 50 and second vertical trenches 51 between the adjacent pairs of first vertical trenches 50 may be etched from the upper surface 16 into the first semiconductor layer 1 to form a plurality of semiconductor mesas. In this process, the dielectric layer 8 is typically used as an etch-stop.

The subsequent processes to form compound semiconductor devices are typically performed similar as explained above with regard to FIGS. 2A to 8.

Figure 10A:
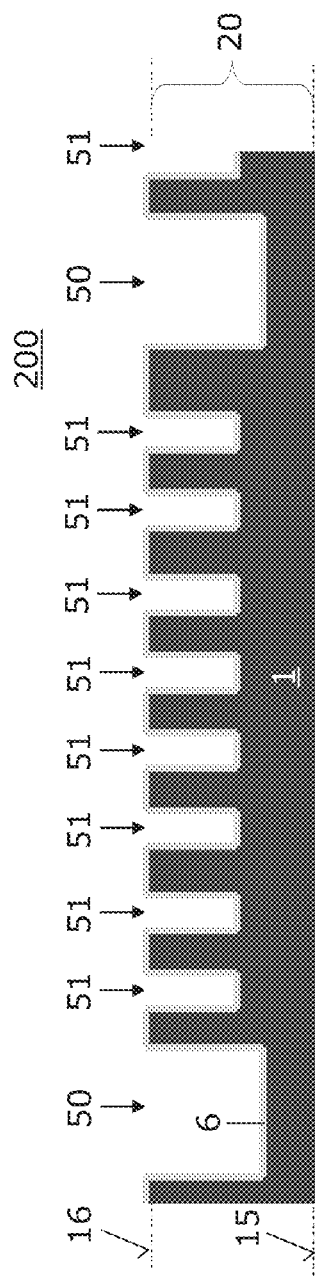
FIGS. 10A to 10C illustrate, in vertical cross-sections, a method for manufacturing semiconductor devices according to an embodiment.
Figure 10B:
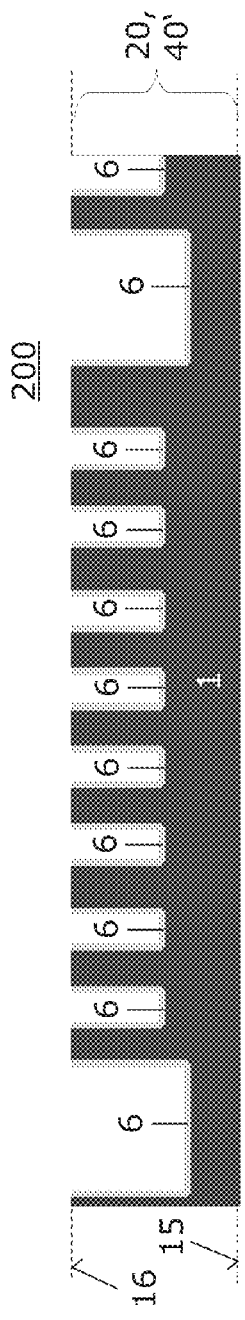

With regard to FIGS. 10A and 10B still a further method for stress-reduced manufacturing semiconductor devices is explained. In a first process, a semiconductor wafer 20 having an upper surface 16 and a first semiconductor layer 1 of a first semiconductor material extending to the upper surface 16 is provided.

Thereafter, in a vertical cross-section which is substantially orthogonal to the upper surface 16, at least two first vertical trenches 50 which extend from the upper surface 16 into the first semiconductor layer 1 and a plurality of second vertical trenches 51, which extend from the upper surface 16 into the first semiconductor layer 1, are arranged between the at least two first vertical trenches 50 and have a smaller horizontal extension than the at least two first vertical trenches 50, are formed. These processes are typically performed similar as explained above with regard to FIGS. 1A and 1B or 9A and 9B.

Thereafter, the side walls and the bottom walls of the first vertical trenches 50 and the second vertical trenches 51 are covered with a dielectric layer 6, typically a conformal dielectric layer 6, for example with a conformal $SiO_2$-layer 6. This may be done by deposition or thermal oxidation resulting in a wafer structure 200 as illustrated in FIG. 10A, and a subsequent process of removing the dielectric layer 6 from the upper surface 16, for example using a CMP-process. The resulting semiconductor wafer structure 200 is illustrated in FIG. 10B and forms a seed-wafer 40'.

The at least two first vertical trenches 50 and the plurality of second vertical trenches 51 are typically formed so that the first vertical trenches 50 have, in the vertical cross-section, a larger horizontal extension than the second vertical trenches 51 to facilitate forming of horizontally separated device regions 201.

Further, the first vertical trenches 50 typically extend vertically deeper into the first semiconductor layer 1 than the second vertical trenches 51. This may facilitate later device separation.

Figure 10C:
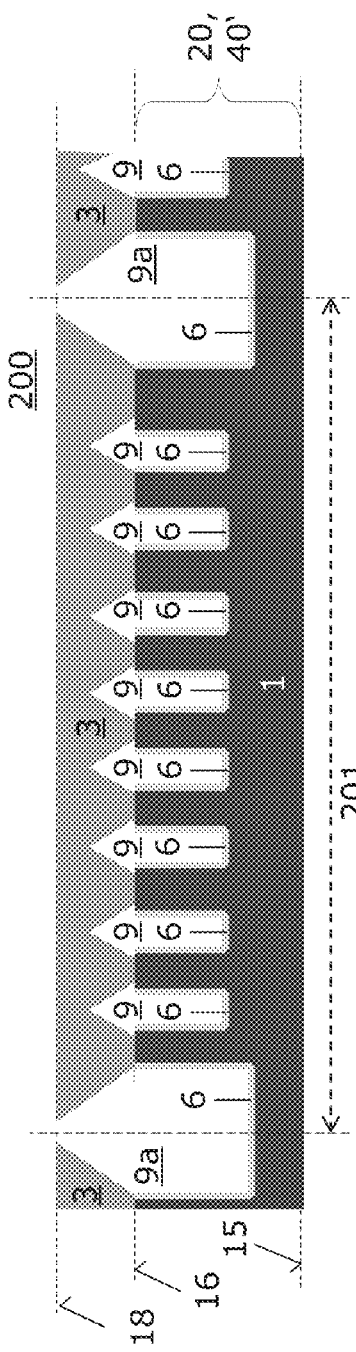

In a further process, third semiconductor layers 3 are formed by epitaxial depositing a second semiconductor material, typically a compound semiconductor material such as GaN, GaAlN or CdTe, at the upper surface 16 so that, in the vertical cross-section, a closed cavity 9 is formed in each of the second vertical trenches 51 and that the at least two first vertical trenches 50 are at most partly covered by the third semiconductor layers 3. The resulting semiconductor wafer structure 200 is illustrated in FIG. 10C.

Since the epitaxial deposition is only local and the formed compound semiconductor structures typically grow to sizes up to a few ten micrometers, the third semiconductor layers 3 grow as monocrystalline layers. To further improve crystal quality, an additional thermal process may be used.

Typically, a plurality of third semiconductor layers 3 are formed which are in horizontal directions spaced apart from each other, i.e. formed as islands when seen from above. This facilitates efficient and stress-reduced forming of compound semiconductor devices which include one or more device regions 201. For sake of clarity, only three third semiconductor layers 3 are illustrated in FIG. 10C.

The further processes are typically performed similar as explained above with regard to FIGS. 2B to 8. This typically also applies to the optional processes explained in the following with regard to FIGS. 11A to 12B that may be used to form semiconductor devices of different semiconductor materials.

Figure 11A:
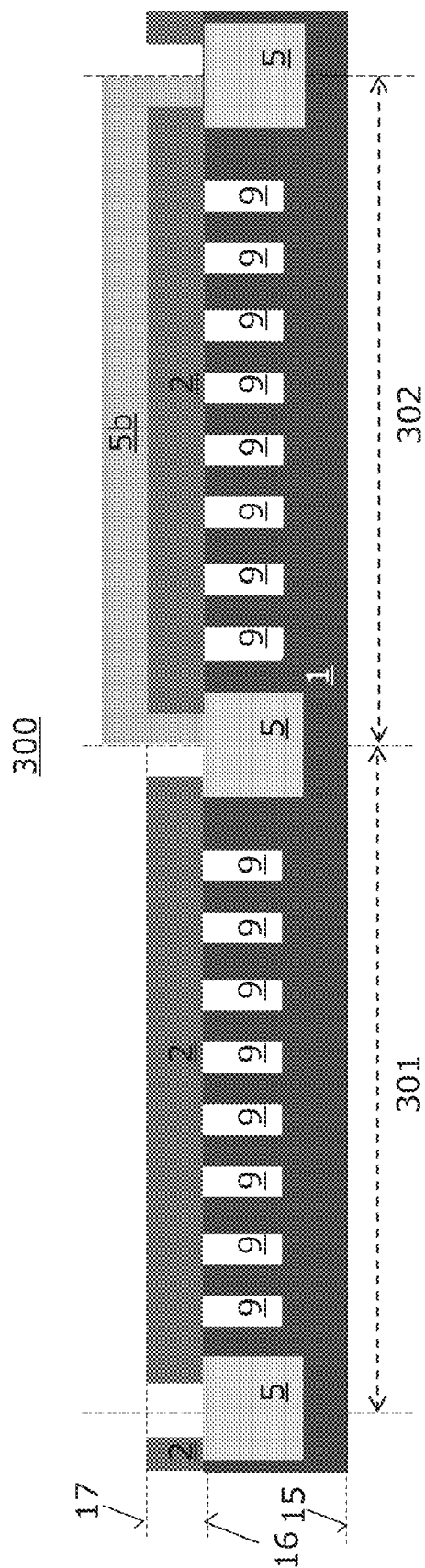
FIGS. 11A to 12B illustrate, in vertical cross-sections, a method for manufacturing semiconductor devices according to a further embodiment.

After forming the seed-wafer 40 as explained above with regard to FIG. 2A, one or more device region 302 may be covered with a mask 5b to form a masked second semiconductor layer 2 in the device region(s) 302. The resulting wafer structure 300 is illustrated in FIG. 11A.

Figure 11B:
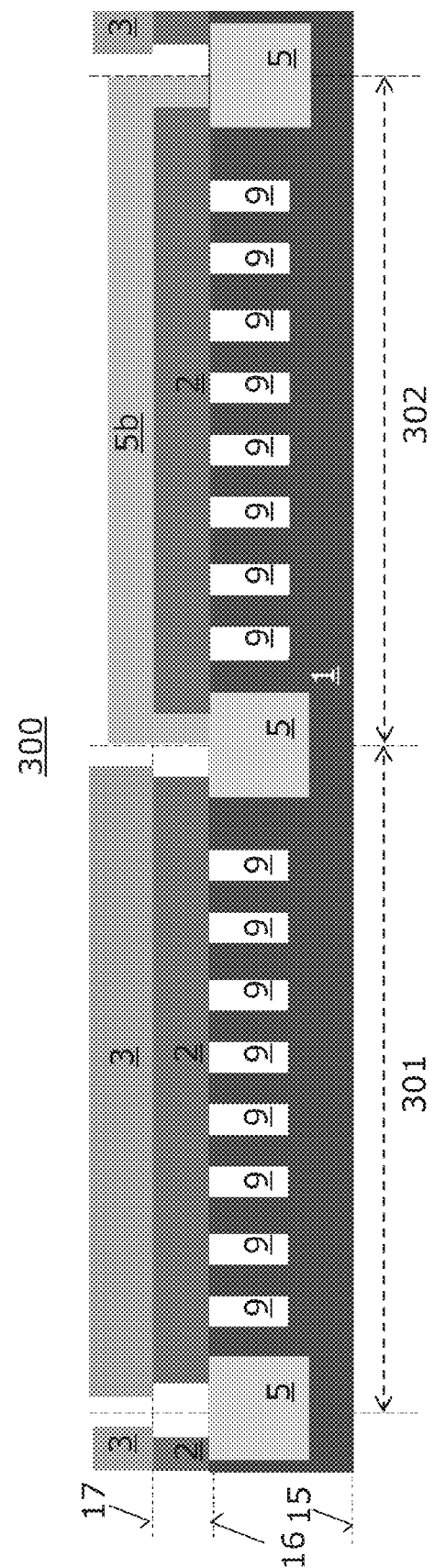

Thereafter, a second semiconductor material is epitaxially deposited at the non-masked second semiconductor layer(s) 2 to form a third semiconductor layer 3 in one or more other device region(s) 301. The resulting wafer structure 300 is illustrated in FIG. 11B.

Figure 12A:
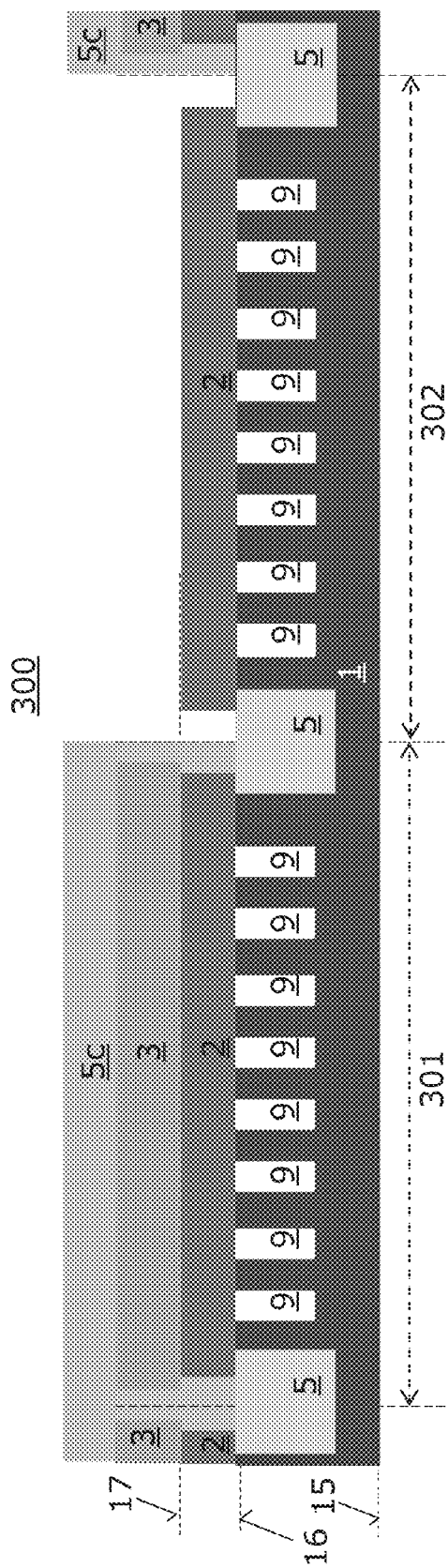
Figure 12B:
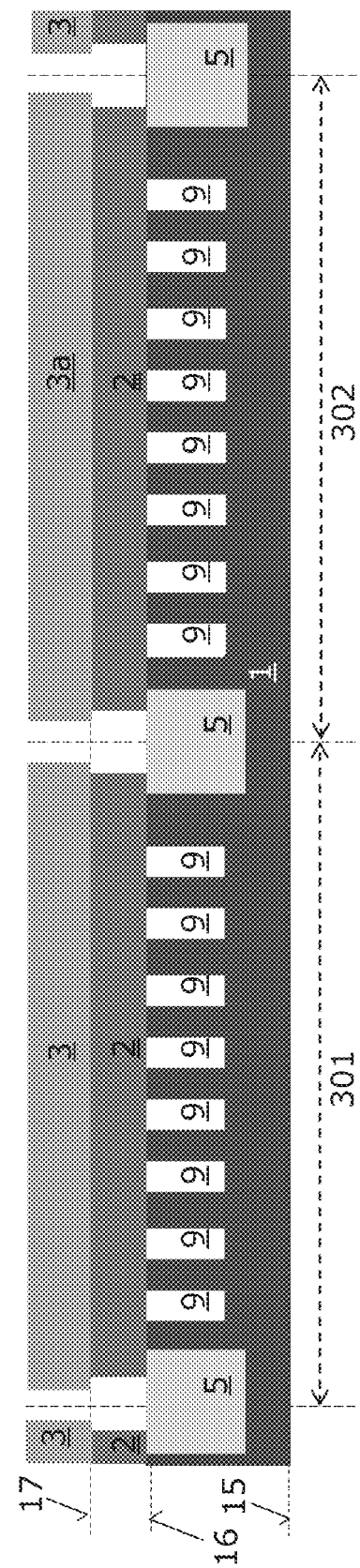

Thereafter, mask 5b is removed to form one or more exposed second semiconductor layers 2. The resulting wafer structure 300 is illustrated in FIG. 12A.

In a further process, a third semiconductor material is epitaxially deposited at the exposed second semiconductor layer 2 of the device region(s) 302 to form a further third semiconductor layer 3a of a different semiconductor material thereon.

More than two device regions of different semiconductor material may be formed in this manner. Furthermore, these processes may also be applied to a seed-wafer 40' as shown in FIG. 10C.

In so doing, semiconductor devices of different materials may be manufactured in an efficient and stress-reduced manner on a single wafer. This also allows manufacturing of chips with device regions of different semiconductor materials. These chips can take the advantages of the different semiconductor materials. In so doing power electronics, high frequency electronics, logical circuitries, sensor devices such as infra-red sensors, sensor electronics and/or even light emitting devices such as semiconductor LEDs (light emitting diodes) may be combined on a chip. Furthermore, different semiconductor LEDs may easily be integrated in one chip. This will be explained in the following with regard to FIGS. 13A to 15B.

After forming suitably seed-wafers 40, 40' as explained above with regard to FIGS. 2A and 10B, respectively, a plurality of third semiconductor layers 3 are formed thereon. During deposition of third semiconductor layers 3 or by subsequent implantation, pn-junctions of LED-structures may be formed in the third semiconductor layers 3. The semiconductor material of the third semiconductor layers 3 is typically a suitably doped compound semiconductor material and chosen in accordance with the wave length to be emitted. For example, InGaN may be used in device regions were blue LEDs are to be manufactured; AlGaInP may be used in device regions were yellow LEDs are to be manufactured; InGaN, GaN, AlGaInP or GaP may be used in device regions were green LEDs are to be manufactured; AlGaAs or GaP may be used in device regions were red LEDs are to be manufactured; and InGaN may be used in device regions were violet LEDs are to be manufactured, to mention only a few examples.

In other embodiments, other semiconductor structures such as diodes, field-effect transistors, bipolar transistors or the like may be formed in at least a few of the third semiconductor layers 3 instead of forming LED-structures. For sake of clarity, the further processes are in following explained mainly with regard to LED-structures. This is however not to be understood as limiting.

The third semiconductor layers 3 may be made of the same compound semiconductor material. In other embodiments, third semiconductor layers 3 of different semiconductor materials are formed. This may be done similar as explained above with regard to FIGS. 11A to 12B. In this way, an RGB-array (red-green-blue) may be manufactured in a stress-reduced and efficient manner.

In a further process, a metallization 14 may be formed, typically deposited, on the third semiconductor layers 3. The resulting wafer structures 2001 and 1001 are illustrated in FIGS. 13A and 13B, respectively. As indicated in FIG. 13A, portions 14a of the material used for forming the metallization 14 may be deposited in the gaps 9a. This does, however, not influence the device properties since the seed-wafers 40, 40' are later removed.

Figure 14B:
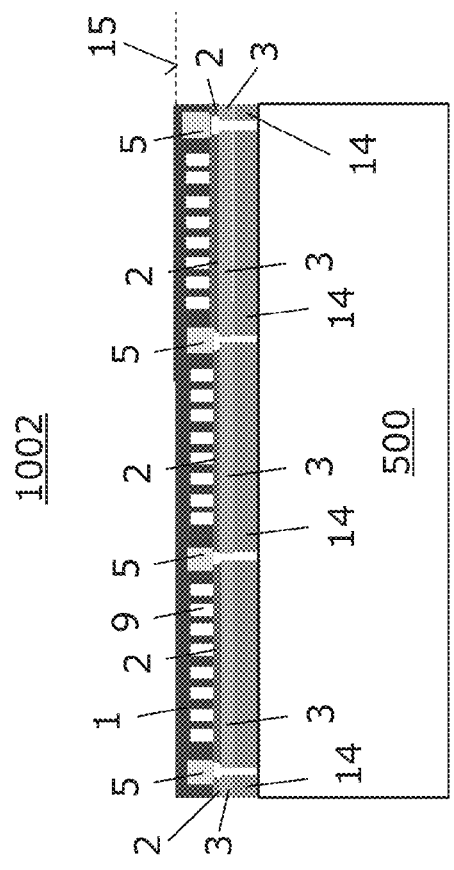

Thereafter, the wafer structures 2001 and 1001 may be mounted with the metallization 14 to a respective carrier wafer 500, for example a silicon carrier wafer 500, a glass carrier wafer 500 or a plastic carrier wafer 500 such as a printed circuit board. The resulting wafer structures 2002 and 1002 are illustrated in FIGS. 14A and 14B, respectively. The carrier wafer 500 typically includes conductor paths 13 to contact the semiconductor structures formed in the third semiconductor layers 3, for example the LED-structures. Furthermore, a driver circuitry may be integrated in the carrier wafer 500.

Thereafter, the seed-wafer 40, 40' may be completely removed to expose the third semiconductor layers 3. This may be done using a CMP-process. The resulting wafer structures 2002 and 1002 are illustrated in FIGS. 14C and 14D, respectively.

Figure 14D:
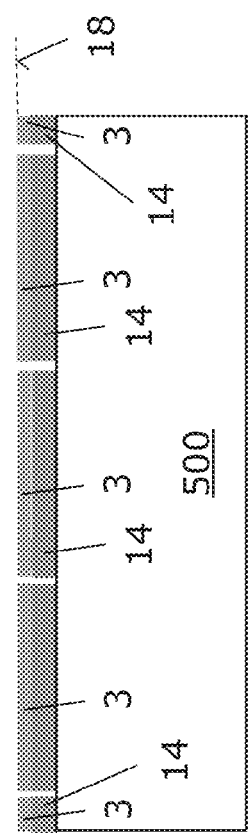
Figure 14A:
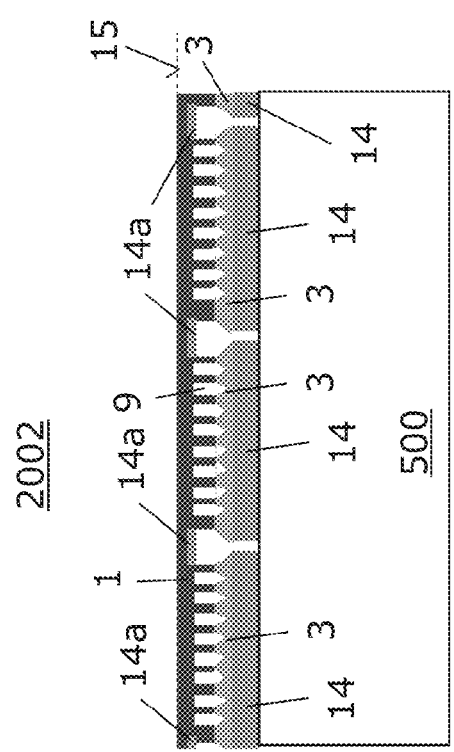
Figure 14C:
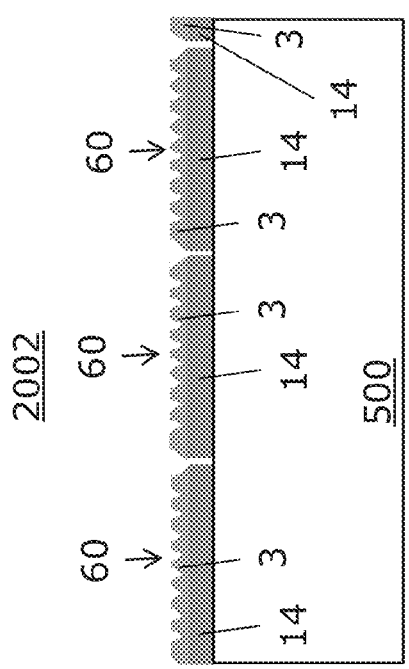

In the embodiment illustrated in FIG. 14C, light diffuser structures 60 are exposed by removing the seed-wafer 40' and the first semiconductor layer 1, respectively. In other words, the closed cavities 9 are typically suitably shaped during forming the seed-wafer 40'. This may be done by choosing appropriate horizontal extensions of the second vertical trenches.

In the embodiment illustrated in FIG. 14D, light diffuser structures may additionally be formed on the exposed third semiconductor layers 3.

Thereafter, the interspaces between neighbouring third semiconductor layers 3 and the metallization 14, respectively, may be filled with dielectrics plugs 5c.

Thereafter, the semiconductor structures formed in third semiconductor layers 3, for example the formed LED-structures, may be wired by conductor paths 13 formed on the third semiconductor layers 3 and dielectrics plugs 5c.

The above described approaches allow the stress-reduced formation of compound semiconductor layers, for example GaN layers on Si. This is beneficial from the process point of view for several reasons.

One reason is that a Si-wafer is comparably cheap relative to other suitable seed material for GaN such as Sapphire or SiC. Furthermore, current technology can only provide 6 inch sapphire or SiC wafers while Silicon technology is able to provide up to 12 inch wafer. Consequently, the deposited GaN layers 3 may have about the same overall size as the large 12 inch Si wafer and thus allows integration of more devices.

A further reason is that—due to reduced mechanical stress—wafer bowing is reduced, in particular when GaN layers 3 having a thickness larger than 6 μm, for example from about 50 μm to about 100 μm are produced.

Even further, different compound semiconductor materials may be used to form the third semiconductor layers 3 on a wafer. This increases flexibility and facilitates integration of optimized devices in single chips.

The above described approaches have in common that a semiconductor wafer with an upper side 16 and a first semiconductor layer 1 of a first semiconductor material at the upper side 16 are provided. In a vertical cross-section which is substantially orthogonal to the upper side, a plurality of first vertical trenches 50 and a plurality of second vertical trenches 51 between adjacent first vertical trenches 50 are formed at the upper side 16 so that the first vertical trenches 50 have, in the vertical cross-section, a larger horizontal extension than the second vertical trenches 51. This is typically done by etching. A plurality of third semiconductor layers 3 are formed at the upper side. The third semiconductor layers 3 are, in the vertical cross-section, spaced apart from each other by gaps 9a each of which overlaps, in the vertical cross-section, with a respective first vertical trench 50 when seen from above. At least one of the third semiconductor layers 3 is made of a semiconductor material which is different to the first semiconductor material.

The plurality of first vertical trenches 50 and the plurality of second vertical trenches 51 are typically formed such that the first vertical trenches 50 extend vertically deeper into the first semiconductor layer 1 than the second vertical trenches 51.

The first semiconductor material may be monocrystalline silicon, germanium or germanium doped silicon. The first semiconductor material may also be poly-crystalline silicon, boron-doped mono-crystalline silicon having a specific resistance of less than about 10 m Ohm cm, or phosphorus-doped mono-crystalline silicon having a specific resistance of less than about 10 m Ohm cm.

The semiconductor material of at least one of the third semiconductor layers is typically a compound semiconductor material such as GaN, GaAs, GaAlN, or InP.

Typically, third semiconductor layers 3 of different semiconductor materials are formed at the upper side.

The plurality of third semiconductor layers 3 typically form, in a cross-section which is substantially parallel to the upper side, a lattice of insular third semiconductor layers 3.

Typically, the plurality of second vertical trenches 51, which are in the vertical cross-section arranged between adjacent first vertical trenches 50, are formed as a contiguous structure when seen from above.

Furthermore, the first vertical trenches 50 and the gaps 9a may be formed as respective contiguous mesh when seen from above.

According to one embodiment, the plurality of first vertical trenches 50 are filled with a dielectric material. Thereafter, second semiconductor layers 2 of the first semiconductor material are formed on the first semiconductor layer 1. Epitaxial depositing a second semiconductor material on at least one of the second semiconductor layers 2 is used to form at least one third semiconductor layer 3.

According to another embodiment, a conformal dielectric layer 6 is formed on the upper side 16. The conformal layer 6 is removed from the upper side 16 at least between a first pair of adjacent first vertical trenches 50 to expose mesa regions 1' between the first pair of adjacent first vertical trenches 50 at an upper surface 16. Third semiconductor layers 3 are, in the vertical cross-section, formed between the first pair of adjacent first vertical trenches 50 by selective epitaxial deposition of a second semiconductor material on the mesa regions 1'.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A method for stress-reduced forming a semiconductor device, comprising:
    providing a semiconductor wafer comprising an upper side and a first semiconductor layer of a first semiconductor material at the upper side;
    forming, in a vertical cross-section which is substantially orthogonal to the upper side, at the upper side a plurality of first vertical trenches and a plurality of second vertical trenches between adjacent first vertical trenches so that the first vertical trenches have, in the vertical cross-section, a larger horizontal extension than the second vertical trenches; and
    forming a plurality of third semiconductor layers at the upper side which are, in the vertical cross-section, spaced apart from each other by gaps each of which overlaps, in the vertical cross-section, with a respective first vertical trench when seen from above, at least one of the third semiconductor layers comprising a semiconductor material which is different to the first semiconductor material,
    wherein the third semiconductor layers comprise different semiconductor materials formed at the upper side.

2. The method of claim 1, wherein the first semiconductor material is selected from a group consisting of silicon, germanium and germanium doped silicon.

3. The method of claim 1, wherein the first semiconductor material is selected from a group consisting of poly-crystalline silicon, boron-doped mono-crystalline silicon comprising a specific resistance of less than about 10 m Ohm cm, and phosphorus-doped mono-crystalline silicon comprising a specific resistance of less than about 10 m Ohm cm.

4. The method of claim 1, wherein the semiconductor material of at least one of the third semiconductor layers is a compound semiconductor material.

5. The method of claim 1, wherein the plurality of second vertical trenches between adjacent first vertical trenches are formed as a contiguous structure when seen from above.

6. The method of claim 1, wherein at least one of the plurality of first vertical trenches and the gaps are formed as a contiguous mesh when seen from above.

7. The method of claim 1, wherein the plurality of third semiconductor layers are, in a cross-section which is substantially parallel to the upper side, formed as a lattice of insular structures.

8. The method of claim 1, wherein the plurality of first vertical trenches and the plurality of second vertical trenches are etched into the first semiconductor layer.

9. The method of claim 1, wherein the second vertical trenches have, in the vertical cross-section, different horizontal extensions.

10. The method of claim 1, wherein the plurality of first vertical trenches and the plurality of second vertical trenches are formed so that the first vertical trenches extend vertically deeper into the first semiconductor layer than the second vertical trenches.

11. The method of claim 1, further comprising prior to forming the plurality of third semiconductor layers at least one of:
    forming at the upper side a plurality of third vertical trenches which extend vertically deeper into the first semiconductor layer than the first vertical trenches;
    filling a plurality of third vertical trenches formed at the upper side with a dielectric material; and
    dividing the semiconductor wafer into individual chips along a plurality of third vertical trenches formed at the upper side.

12. The method of claim 1, further comprising at least one of:
    forming a diode in at least one of the third semiconductor layers;
    forming a LED in at least one of the third semiconductor layers;
    forming a bipolar transistor in at least one of the third semiconductor layers;
    forming a field-effect structure in at least one of the third semiconductor layers; and
    forming at least a first metallization on at least one of the third semiconductor layers, forming a second metallization which is arranged opposite to the first metallization on at least one of the third semiconductor layers, mounting the first metallization to a carrier wafer, and thinning the first semiconductor layer on a surface of the first semiconductor layer which is opposite to the upper side.

13. The method of claim 1, wherein forming the plurality of third semiconductor layers comprises at least one of:
    filling the plurality of first vertical trenches with a dielectric material; and
    forming second semiconductor layers of the first semiconductor material on the first semiconductor layer, masking at least one of the second semiconductor layers to form at least one masked second semiconductor layer, epitaxial depositing a second semiconductor material on at least one of the second semiconductor layers to form at least one third semiconductor layer, unmasking at least one of the at least one masked second semiconductor layers to form at least one exposed second semiconductor layer, and epitaxial depositing a third semiconductor material on the at least one exposed second semiconductor layer to form at least a further third semiconductor layer.

14. The method of claim 1, wherein forming the plurality of third semiconductor layers comprises:
- depositing a conformal dielectric layer on the upper side;
- removing the conformal layer from the upper side at least between a first pair of adjacent first vertical trenches to expose mesa regions between the first pair of adjacent first vertical trenches at an upper surface;
- forming a third semiconductor layer between the first pair of adjacent first vertical trenches by selective epitaxial deposition of a second semiconductor material on the mesa regions;
- masking the third semiconductor layer;
- removing the conformal layer from the upper side at least between a second pair of neighboring first vertical trenches to expose mesa regions between the second pair of adjacent first vertical trenches at the upper side; and
- forming at least one further third semiconductor layer by selective epitaxial deposition of a third semiconductor material on the semiconductor mesas arranged between the second pair of neighboring first vertical trenches.

15. A method for stress-reduced forming a semiconductor device, comprising:
- providing a semiconductor wafer comprising an upper surface and a first semiconductor layer of a first semiconductor material extending to the upper surface;
- forming, in a vertical cross-section which is substantially orthogonal to the upper surface, at least two first vertical trenches which extend from the upper surface into the first semiconductor layer and a plurality of second vertical trenches which extend from the upper surface into the first semiconductor layer and are arranged between the at least two first vertical trenches;
- filling the at least two first vertical trenches with a dielectric material to form in the vertical cross-section a dielectric plug in each of the at least two first vertical trenches;
- forming a second semiconductor layer of the first semiconductor material on the upper surface so that, in the vertical cross-section, a closed cavity is formed in each of the second vertical trenches; and
- selective epitaxial depositing of a second semiconductor material on the second semiconductor layer to form a third semiconductor layer so that each of the dielectric plugs is at most partly covered when seen from above.

16. The method of claim 15, wherein the first semiconductor material is selected from a group consisting of mono-crystalline silicon, mono-crystalline germanium, mono-crystalline germanium doped silicon, poly-crystalline silicon, boron-doped mono-crystalline silicon comprising a specific resistance of less than about 10 m Ohm cm, and phosphorus-doped mono-crystalline silicon comprising a specific resistance of less than about 10 m Ohm cm.

17. The method of claim 15, wherein at least one of the second semiconductor layer and the third semiconductor layer is, in a respective cross-section which is substantially parallel to the upper surface, formed as an island.

18. The method of claim 15, wherein the at least two first vertical trenches and the plurality of second vertical trenches are formed so that the first vertical trenches extend vertically deeper into the first semiconductor layer than the second vertical trenches.

19. The method of claim 15, wherein the at least two first vertical trenches and the plurality of second vertical trenches are formed so that the at least two first vertical trenches comprise, in the vertical cross-section, a smaller horizontal extension than the at least two first vertical trenches.

20. A method for stress-reduced forming a semiconductor device, comprising:
- providing a semiconductor wafer comprising an upper surface and a first semiconductor layer of a first semiconductor material extending to the upper surface;
- forming, in a vertical cross-section which is substantially orthogonal to the upper surface, at least two first vertical trenches which extend from the upper surface into the first semiconductor layer and a plurality of second vertical trenches which extend from the upper surface into the first semiconductor layer, are arranged between the at least two first vertical trenches and comprise a smaller horizontal extension than the at least two first vertical trenches;
- covering the side walls and the bottom walls of the at least two first vertical trenches and the second vertical trenches with a dielectric layer; and
- epitaxial depositing a second semiconductor material at the upper surface to form a third semiconductor layer so that, in the vertical cross-section, a closed cavity is formed in each of the second vertical trenches and that the at least two first vertical trenches are at most partly covered by the third semiconductor layer.

21. The method of claim 20, wherein the first semiconductor material is selected from a group consisting of mono-crystalline silicon, mono-crystalline germanium, mono-crystalline germanium doped silicon, poly-crystalline silicon, boron-doped mono-crystalline silicon comprising a specific resistance of less than about 10 m Ohm cm, and phosphorus-doped mono-crystalline silicon comprising a specific resistance of less than about 10 m Ohm cm.

22. The method of claim 20, wherein the third semiconductor layer is, in a cross-section which is substantially parallel to the upper surface, formed as an island.

23. The method of claim 20, wherein the at least two first vertical trenches and the plurality of second vertical trenches are formed so that the first vertical trenches extend vertically deeper into the first semiconductor layer than the second vertical trenches.

24. The method of claim 20, further comprising a least one of:
- forming an LED-structure in the third semiconductor layer; and
- removing the first semiconductor layer to expose a diffuser structure of the third semiconductor layer.

25. A method for stress-reduced forming a semiconductor device, comprising:
- providing a semiconductor wafer comprising an upper side and a first semiconductor layer of a first semiconductor material at the upper side;
- forming, in a vertical cross-section which is substantially orthogonal to the upper side, at the upper side a plurality of first vertical trenches and a plurality of second vertical trenches between adjacent first vertical trenches so that the first vertical trenches have, in the vertical cross-section, a larger horizontal extension than the second vertical trenches; and
- forming a plurality of third semiconductor layers at the upper side which are, in the vertical cross-section, spaced apart from each other by gaps each of which overlaps, in the vertical cross-section, with a respective first vertical trench when seen from above, at least one of the third semiconductor layers comprising a semiconductor material which is different to the first semiconductor material,
- wherein the first semiconductor material is selected from a group consisting of poly-crystalline silicon, boron-doped mono-crystalline silicon comprising a specific resistance of less than about 10 m Ohm cm, and phosphorus-doped mono-crystalline silicon comprising a specific resistance of less than about 10 m Ohm cm.

26. A method for stress-reduced forming a semiconductor device, comprising:
   providing a semiconductor wafer comprising an upper side and a first semiconductor layer of a first semiconductor material at the upper side;
   forming, in a vertical cross-section which is substantially orthogonal to the upper side, at the upper side a plurality of first vertical trenches and a plurality of second vertical trenches between adjacent first vertical trenches so that the first vertical trenches have, in the vertical cross-section, a larger horizontal extension than the second vertical trenches; and
   forming a plurality of third semiconductor layers at the upper side which are, in the vertical cross-section, spaced apart from each other by gaps each of which overlaps, in the vertical cross-section, with a respective first vertical trench when seen from above, at least one of the third semiconductor layers comprising a semiconductor material which is different to the first semiconductor material,
   wherein at least one of the plurality of first vertical trenches and the gaps are formed as a contiguous mesh when seen from above.

27. A method for stress-reduced forming a semiconductor device, comprising:
   providing a semiconductor wafer comprising an upper side and a first semiconductor layer of a first semiconductor material at the upper side;
   forming, in a vertical cross-section which is substantially orthogonal to the upper side, at the upper side a plurality of first vertical trenches and a plurality of second vertical trenches between adjacent first vertical trenches so that the first vertical trenches have, in the vertical cross-section, a larger horizontal extension than the second vertical trenches; and
   forming a plurality of third semiconductor layers at the upper side which are, in the vertical cross-section, spaced apart from each other by gaps each of which overlaps, in the vertical cross-section, with a respective first vertical trench when seen from above, at least one of the third semiconductor layers comprising a semiconductor material which is different to the first semiconductor material,
   wherein the plurality of first vertical trenches and the plurality of second vertical trenches are formed so that the first vertical trenches extend vertically deeper into the first semiconductor layer than the second vertical trenches or so that the second vertical trenches have, in the vertical cross-section, different horizontal extensions.

* * * * *